(12) United States Patent
Kim et al.

(10) Patent No.: US 12,074,630 B2
(45) Date of Patent: Aug. 27, 2024

(54) TRANSCEIVER USING ACTIVE DEVICE AND ANTENNA MODULE INCLUDING THE SAME

(71) Applicant: Samsung Electronics Co., Ltd., Suwon-si (KR)

(72) Inventors: Youngmin Kim, Yongin-si (KR); Hongjong Park, Seoul (KR); Iljin Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 44 days.

(21) Appl. No.: 17/874,717

(22) Filed: Jul. 27, 2022

(65) Prior Publication Data

US 2023/0069142 A1 Mar. 2, 2023

(30) Foreign Application Priority Data

Aug. 24, 2021 (KR) .......................... 10-2021-0111870

(51) Int. Cl.
  *H04B 1/401* (2015.01)
  *H03K 17/687* (2006.01)
(52) U.S. Cl.
  CPC ......... *H04B 1/401* (2013.01); *H03K 17/6872* (2013.01)
(58) Field of Classification Search
  None
  See application file for complete search history.

(56) References Cited

U.S. PATENT DOCUMENTS

| | | | |
|---|---|---|---|
| 6,356,536 B1 | 3/2002 | Repke | |
| 6,617,928 B2 | 9/2003 | Finlay et al. | |
| 7,212,788 B2 | 5/2007 | Weber et al. | |
| 7,493,152 B1 * | 2/2009 | Fifield | H04B 7/061 |
| | | | 455/552.1 |
| 8,909,171 B2 | 12/2014 | Kim et al. | |
| 8,913,976 B2 | 12/2014 | Khatri et al. | |
| 10,469,120 B1 * | 11/2019 | Cetinoneri | H04B 1/18 |
| 10,476,546 B2 | 11/2019 | Margomenos | |
| 10,847,901 B1 * | 11/2020 | Ayala Vazquez | H01Q 1/521 |
| 2015/0180465 A1 * | 6/2015 | Na | H03K 17/6871 |
| | | | 327/382 |
| 2019/0229756 A1 * | 7/2019 | Liu | H04B 1/0057 |
| 2019/0319664 A1 | 10/2019 | Emira et al. | |

(Continued)

OTHER PUBLICATIONS

Extended European Search Report dated Jan. 16, 2023 for corresponding European Application No. 22191797.4.

*Primary Examiner* — Kenneth B Wells

(74) *Attorney, Agent, or Firm* — Harness, Dickey & Pierce, P.L.C.

(57) ABSTRACT

A transceiver includes a first integrated circuit, a second integrated circuit and an antenna array. The first integrated circuit including a transmission chain, a reception chain, and a control circuit, the transmission chain configured to transmit a first radio frequency (RF) signal and the reception chain configured to receive a second RF signal, and the control circuit configured to selectively ground any one of the transmission chain and the reception chain according to a transmission mode or a reception mode; the second integrated circuit including an active device connected to the transmission chain and the reception chain; and the antenna array including an antenna connected to the active device.

19 Claims, 25 Drawing Sheets

(56) References Cited

U.S. PATENT DOCUMENTS

2020/0057746 A1\* 2/2020 Obkircher ........... G06F 13/4291
2020/0059208 A1 2/2020 Yang et al.
2021/0028797 A1 1/2021 Kim et al.

\* cited by examiner

TRANSCEIVER USING ACTIVE DEVICE AND ANTENNA MODULE INCLUDING THE SAME

CROSS-REFERENCE TO RELATED APPLICATION

This application is based on and claims priority under 35 U.S.C. § 119 to Korean Patent Application No. 10-2021-0111870, filed on Aug. 24, 2021, in the Korean Intellectual Property Office, the disclosure of which is incorporated by reference herein in its entirety.

BACKGROUND

The inventive concepts relate to wireless communication, and more particularly, to a transceiver for wireless communication and an antenna module including the same.

In order to increase data throughput in wireless communication, an extended frequency band may be used, and accordingly, a wireless communication device may be required to have the ability to process a high frequency signal. For example, a 5G millimeter wave (mmWave) frequency allocation distributed by the 3rd Generation Partnership Project (3GPP) includes a high frequency band equal to or greater than 20 GHz. In order to process such a high-frequency signal well, a high-performance transceiver may be included in the wireless communication device.

The high-performance transceiver may be required to have high usability such as low cost, low power consumption, low operating temperature, and high stability as well as high performance. In particular, a transceiver included in a portable wireless communication device such as a mobile phone may be required to have higher usability due to limited space, temperature, and power.

SUMMARY

The inventive concepts provide a transceiver that provides an enhanced communication performance and an improved usability and an antenna module including the transceiver.

According to an aspect of the inventive concepts, there is provided a transceiver including a first integrated circuit, a second integrated circuit, and an antenna array. The first integrated circuit includes a transmission chain configured to transmit a first radio frequency (RF) signal, a reception chain configured to receive a second RF signal and a control circuit configured to selectively ground any one of the transmission chain and the reception chain according to a transmission mode or a reception mode. The second integrated circuit includes an active device connected to the transmission chain and the reception chain. The antenna array includes an antenna connected to the active device.

According to another aspect of the inventive concepts, there is provided a transceiver including a first integrated circuit, a second integrated circuit, and an antenna array. The first integrated circuit includes a transmission chain configured to transmit a first radio frequency (RF) signal, a reception chain configured to receive a second RF signal, a first output pin connected to the transmission chain, and a first input pin connected to the reception chain. The antenna array includes an antenna configured to transmit the first RF signal to the outside or to receive the second RF signal from the outside. The second integrated circuit includes a second output pin connected to the first output pin, a second input pin connected to the first input pin, an input/output pin connected to the antenna, and an active device connected to the second output pin, the second input pin, and the input/output pin. The first integrated circuit is implemented in a complementary metal oxide semiconductor (CMOS) process, and the second integrated circuit is implemented in a Group III-V compound semiconductor process.

According to another aspect of the inventive concepts, there is provided an antenna module including a multi-layered substrate, a first integrated circuit and a second integrated circuit. The multi-layer substrate includes an antenna configured to transmit and receive electromagnetic waves through an upper surface of a multi-layer substrate. The first integrated circuit includes, on a lower surface of the multi-layer substrate, a transmission chain, a reception chain, a first output pin connected to the transmission chain, and a first input pin connected to the reception chain. The second integrated circuit includes, on the lower surface of the multi-layer substrate, a second output pin connected to the first output pin, a second input pin connected to the first input pin, an input/output pin and the second output pin connected to the antenna, and an active device connected to the second input pin and the input/output pin. The active device is configured to amplify the first RF signal received from the transmission chain through the second output pin and output the first radio frequency (RF) signal to the antenna through the input/output pin in a transmission mode or output the second RF signal received from the antenna through the input/output pin to the reception chain through the second input pin in a reception mode.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF THE EMBODIMENTS

Figure 1:
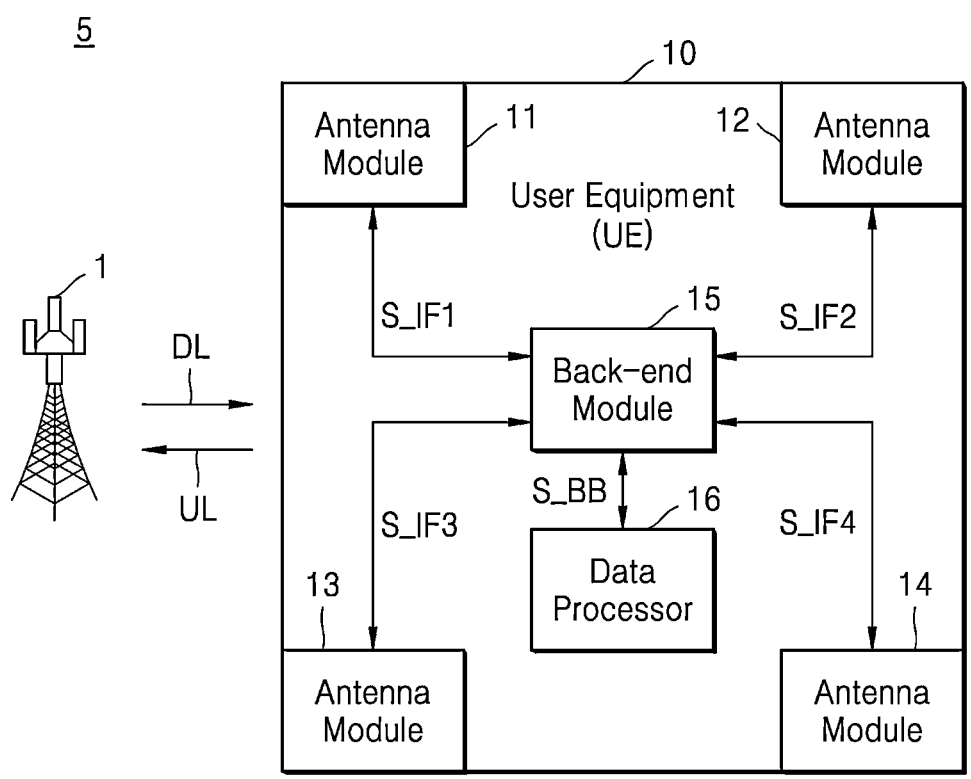
FIG. 1 is a block diagram illustrating a wireless communication system according to an example embodiment.

FIG. 1 is a block diagram illustrating a wireless communication system 5 according to an example embodiment. As a non-limiting example, the wireless communication system 5 may be a wireless communication system using a cellular network such as a 5$^{th}$ generation (5G) wireless system, a Long Term Evolution (LTE) system, an LTE-Advanced system, a Code Division Multiple Access (CDMA) system, a Global System for Mobile Communications (GSM) system, etc., and may be a Wireless Personal Area Network (WPAN) system or any other wireless communication system. Hereinafter, the wireless communication system 5 using a cellular network is described, but it should be understood that example embodiments are not limited thereto.

A base station (BS) 1 may generally refer to a fixed station that communicates with user equipment (UE) 10 and/or another BS, and may exchange data and control information by communicating with the UE 10 and/or the other BS. For example, the BS 1 may be referred to as a node B, an evolved-node B (eNB), a next generation node B (gNB), a sector, a site, a base transceiver system (BTS), an access point (AP), a relay node, a remote radio head (RRH), a radio unit (RU), a small cell, etc. Herein, a BS or cell may be interpreted as a region or function covered by a base station controller (BSC) in CDMA, a Node-B in Wideband Code Division Multiple Access (WCDMA), an eNB in LTE, a gNB or sector (site) in 5G, etc., and may include various coverage regions such as megacell, macrocell, microcell, picocell, femtocell, relay node, RRH, RU, small cell communication range, etc.

The UE 10 may be fixed or mobile, and may refer to any devices capable of transmitting and receiving data and/or control information by communicating with a BS (e.g., BS 1). For example, the UE 10 may be referred to as a terminal, terminal equipment, a mobile station (MS), a mobile terminal (MT), a user terminal (UT), a subscriber station (SS), a wireless device, a handheld device, etc. Hereinafter, example embodiments are described with the UE 10 as a wireless communication device, but it should be understood that example embodiments are not limited thereto.

A wireless communication network between the UE 10 and the BS 1 may support communication between multiple users by sharing available network resources. For example, in the wireless communication network, information may be transmitted in various multiple access methods such as CDMA, Frequency Division Multiple Access (FDMA), Time Division Multiple Access (TDMA), Orthogonal Frequency Division Multiple Access (OFDMA), Single Carrier Frequency Division Multiple Access (SC-FDMA), OFDM-FDMA, OFDM-TDMA, OFDM-CDMA, etc. As shown in FIG. 1, the UE 10 may communicate with the BS 1 through an uplink UL and a downlink DL. In some embodiments, UEs may communicate with each other via a sidelink, such as Device-to-Device (D2D).

Referring to FIG. 1, the UE 10 may include first to fourth antenna modules 11 to 14, a back-end module 15, and a data processor 16. In some embodiments, the first to fourth antenna modules 11 to 14 may be spaced apart from each other and independently packaged. In some embodiments, the back-end module 15 and the data processor 16 may be independently packaged or may be commonly packaged.

Each of the first to fourth antenna modules 11 to 14 may include at least one antenna, and may process a signal received through the antenna and a signal to be transmitted through the antenna. In some embodiments, the first to fourth antenna modules 11 to 14 may respectively generate or process first to fourth intermediate frequency (IF) signals S_IF1 to S_IF4. For example, the first antenna module 11 may generate the first IF signal S_IF1 from an RF signal received through the antenna, and process the first IF signal S_IF1 provided from the back-end module 15, thereby outputting the generated RF signal through the antenna. In some embodiments, each of the first to fourth antenna modules 11 to 14 may be referred to as a front-end module or an RF module. Structures according to example implementations of the first to fourth antenna modules 11 to 14 are described with reference to FIGS. 2A and 2B.

A signal having a short wavelength in a high frequency band such as millimeter wave (mmWave) bend less around obstacles than larger wavelength signals, and accordingly, communication quality may be influenced by interference by an obstacle and/or direction of an antenna. The UE 10 may include a plurality of antenna modules, for example, the first to fourth antenna modules 11 to 14, so as to enable communication with the BS 1 although transmission and reception of a signal through an antenna module are blocked by an obstacle such as a user's body or despite even the direction of the UE 10. As shown in FIG. 1, the first to fourth antenna modules 11 to 14 included in the UE 10 may be spaced apart from each other, and in some embodiments, the first to fourth antenna modules 11 to 14 may be spaced apart from each other at the edge of the UE 10. In some embodiments, the UE 10 may include a different number of antenna modules than as shown in FIG. 1.

As the performance required for the antenna module increases, the complexity of the antenna module may increase, and requirements for implementing the antenna module, such as space, power, cost, etc., may increase. Moreover, as described above, as the UE 10 includes a plurality of antenna modules, an increase in requirements for the implementation of the antenna module may be a high burden on the UE 10. As described below with reference to the drawings, a transceiver of each of the first to fourth antenna modules 11 to 14 may include a first integrated circuit including transmission chains and reception chains and a second integrated circuit including an active device array. Herein, the active device array may include a plurality of active devices connected to a plurality of antennas through input/output pins included in the second integrated circuit. Herein, the connection between elements may include an electrical connection state or a physical connection state.

In an example embodiment, the first integrated circuit and the second integrated circuit may be implemented by different processes. For example, the second integrated circuit may be implemented using a high-cost process to ensure higher performance than that of the first integrated circuit so that active devices included in the second integrated circuit may provide high output current and high linearity. In addition, circuits necessary for smooth operations of active devices of the second integrated circuit are integrated into the first integrated circuit, and thus, efficiency may be improved in terms of design area and cost. In addition, the active device functioning as a significant heat source is separated from each of the first to fourth antenna modules 11 to 14, and thus, high stability may be provided.

The back-end module 15 may process or generate a baseband signal S_BB. For example, the back-end module 15 may generate at least one of the first to fourth IF signals S_IF1 to S_IF4 by processing the baseband signal S_BB provided from the data processor 16, and may generate the baseband signal S_BB by processing at least one of the first to fourth IF signals S_IF1 to S_IF4. In some embodiments, differently from that shown in FIG. 1, the first to fourth antenna modules 11 to 14 may respectively generate and provide baseband signals to the data processor 16. In this case, the back-end module 15 may be omitted.

The data processor 16 may extract information to be transmitted by the BS 1 from the baseband signal S_BB received from the back-end module 15, and may generate the baseband signal S_BB including information to be transmitted to the BS 1. The data processor 16 may include a hardware block designed through logic synthesis, or may include a processing block including a software module including a series of instructions and a processor executing the software module. The data processor 16 may also be referred to as a communication processor, a baseband processor, a modem, etc.

Figure 2A:
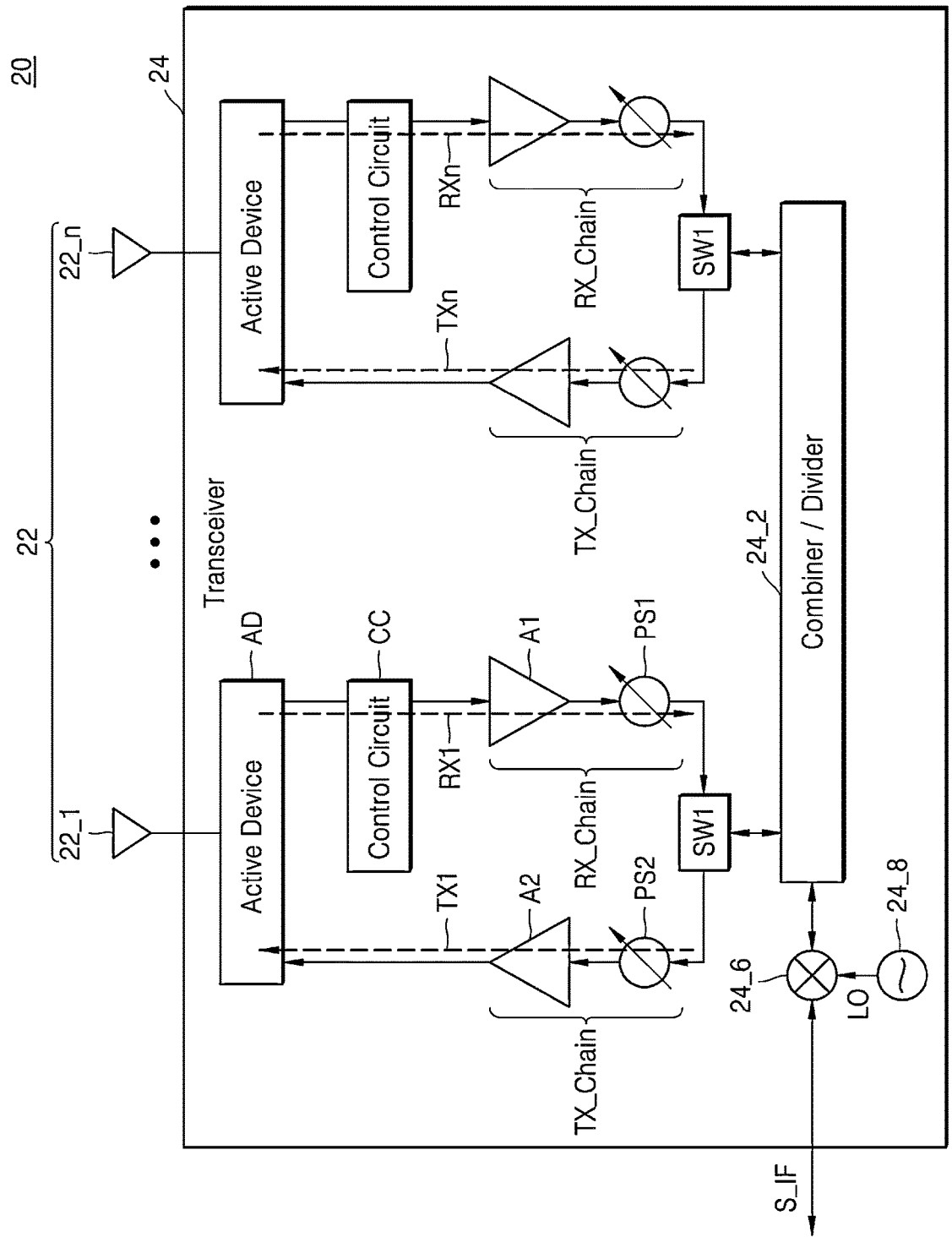
FIGS. 2A and 2B are block diagrams illustrating an antenna module according to an example embodiment.
Figure 2B:
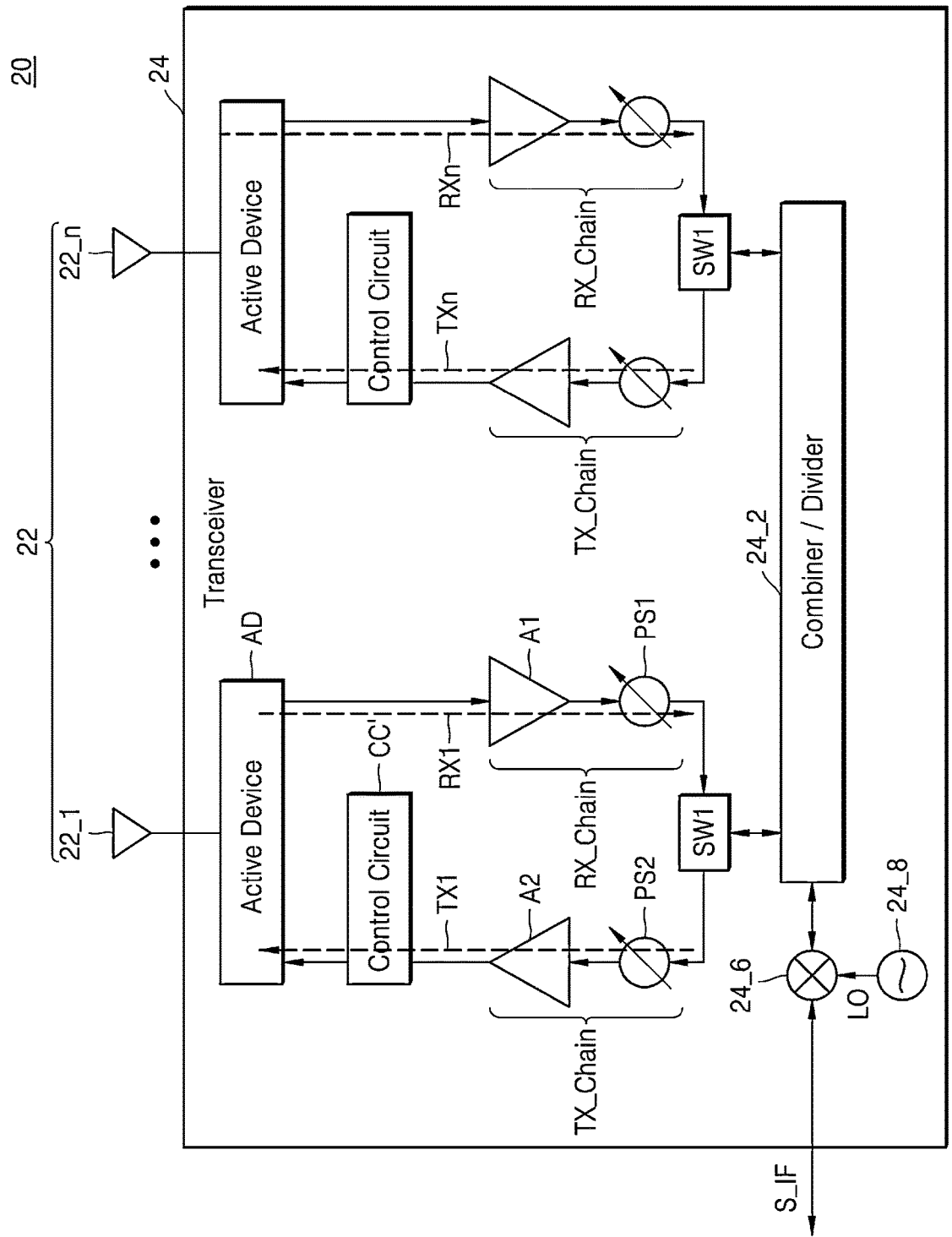

FIGS. 2A and 2B are block diagrams illustrating an antenna module 20 according to an example embodiment.

Referring to FIG. 2A, the antenna module 20 may include first to n-th (where n is an integer greater than 1) antennas 22_1 to 22_n and a transceiver 24. As described above with reference to FIG. 1, the antenna module 20 may output first to n-th RF signals S_RF1 to S_RFn to the first to n-th antennas 22_1 to 22_n or receive the first to n-th RF signals S_RF1 to S_RFn from the first to n-th antennas 22_1 to 22_n and may generate or receive an IF signal S_IF. The antenna module 20 of FIG. 2A may be an example of each of the first to fourth antenna modules 11 to 14 of FIG. 1, and FIG. 2A will be described below with reference to FIG. 1.

In an example embodiment, the first to n-th antennas 22_1 to 22_n may be used for spatial diversity, polarization diversity, spatial multiplexer, beamforming, etc. Each of the first to n-th antennas 22_1 to 22_n may be any type of antenna, for example, a patch antenna, a dipole antenna, etc. As shown in FIG. 2A, the transceiver 24 may include circuits corresponding to the first to n-th antennas 22_1 to 22_n, respectively, and may include a combiner/divider 24_2, a mixer 24_6 and a local oscillating (LO) generator 24_8.

In the transceiver 24, n transmission paths and n reception paths corresponding to the first to n-th antennas 22_1 to 22_n may be formed. For example, as shown in FIG. 2A, a first transmission path TX1 and a first reception path RX1 corresponding to the first antenna 22_1 may be formed, and an n-th transmission path TXn and an n-th reception path RXn corresponding to the n-th antenna 22_n may be formed. Hereinafter, the configuration related to the first transmission path TX1 and the first reception path RX1 of the transceiver 24 is described, and the described configuration may also be applied to configurations related to other transmission paths and other reception paths.

In an example embodiment, the transceiver 24 may include an active device AD, a control circuit CC, a transmission chain TX_Chain, a reception chain RX_Chain, and a first switch SW1. The reception chain RX_Chain may include a low noise amplifier A1 and a first phase shifter PS1, and the transmission chain TX_Chain may include a second phase shifter PS2 and a power amplifier A2.

In an example embodiment, the active device AD may be connected to the transmission chain TX_Chain, and may be connected to the reception chain RX_Chain through the control circuit CC. The control circuit CC may selectively ground the reception chain RX_Chain according to an operation mode. The operation mode may include a transmission mode in which an RF signal is transmitted and a reception mode in which the RF signal is received. In addition, the control circuit CC may include a matching network provided to any one of the transmission chain TX_Chain and the reception chain RX_Chain according to the operation mode. Herein, the matching network may include a plurality of passive devices having a preset value for impedance matching when a first RF signal is transmitted or a second RF signal is received. Herein, an RF signal transmitted by the transceiver 20 is referred to as the first RF signal, and an RF signal received by the transceiver 20 is referred to as the second RF signal.

In an example embodiment, the active device AD may amplify the first RF signal received through the first transmission path TX1 in a transmission mode and output the first RF signal to the first antenna 22_1. The control circuit CC may ground the reception chain RX_Chain in the transmission mode. In addition, the control circuit CC may provide matching impedance to the transmission chain TX_Chain in the transmission mode.

In an example embodiment, the active device AD may amplify the second RF signal received from the first antenna 22_1 in a reception mode and output the second RF signal to the first reception path RX1. The control circuit CC may not ground the reception chain RX_Chain in the reception mode. Also, the control circuit CC may provide matching impedance to the reception chain RX_Chain in the reception mode.

With further reference to FIG. 2B, a control circuit CC' may be connected between the active device AD and the transmission chain TX_Chain, unlike the control circuit CC of FIG. 2A. In an example embodiment, the control circuit CC' may selectively ground the transmission chain TX_Chain according to the operation mode, and may provide matching impedance to any one of the transmission chain TX_Chain and the reception chain RX_Chain according to the operation mode.

Referring back to FIG. 2A, the combiner/divider 24_2 may be selectively connected to any one of the transmission chain TX_Chain and the reception chain RX_Chain through the first switch SW1 according to the operation mode. In an example embodiment, the first switch SW1 may be implemented as a single-pole-double-throw (SPDT) switch. Specifically, the combiner/divider 24_2 may be connected to the transmission chain TX_Chain through the first switch SW1 in the transmission mode, and may be connected to the reception chain TX_Chain through the first switch SW1 in the reception mode.

The combiner/divider 24_2 may transmit the first RF signal that is up-converted from the IF signal S_IF by an LO signal in the transmission mode to the first transmission path TX1, and may provide a signal in which the second RF signal received from the first reception path RX1 and at least one other RF signal (e.g., the RF signal received through an n-th reception path RXn) are combined in the reception mode to the mixer 24_6. The mixer 24_6 may perform up-conversion or down-conversion according to the LO signal. The LO generator 24_8 may generate the LO signal based on a carrier frequency or the like, and in some embodiments, may include a phased locked loop (PLL).

In an example embodiment, the active device AD may form a structure similar to that of the power amplifier A2 in association with the matching network of the control circuit CC in the transmission mode. In some embodiments, the active device AD in FIG. 2B may be associated with the matching network of the control circuit CC in the reception mode to form a structure similar to that of the low noise amplifier A1. In an example embodiment, the transceiver 24 may include a multi-stage amplification structure including the power amplifier A2 and the active device AD. In this regard, the active device AD may last amplify the first RF signal output through the antenna 22_1 in the transmission mode. In some embodiments, the transceiver 24 in FIG. 2B may include a multi-stage amplification structure including the active device AD and the low noise amplifier A1. In this regard, the active device AD may first amplify the second RF signal received from the antenna 22_1 in the reception mode. In some embodiments, some of the elements constituting the transmission path and/or the reception path and shown in FIGS. 2A and 2B may be omitted, and the elements may be arranged differently from those shown in FIGS. 2A and 2B.

The elements included in the transceiver 24 may be manufactured in a semiconductor process. In an example, when the transceiver 24 is manufactured as a single chip in a complementary metal oxide semiconductor (CMOS) process, the transceiver 24 may provide low cost and high integration, while providing relatively low output power capability, low linearity and weak breakdown characteristics. In another example, when the transceiver 24 is manufactured as a single chip in a Bipolar-CMOS (BiCMOS) process, such as a SiGe BiCMOS process, the transceiver 24 may provide higher output power capability, while causing high cost compared to the CMOS process. In another example, when the transceiver 24 is manufactured as a single chip, for example, a Group III-V compound semiconductor process, the transceiver 24 may provide higher output power capability and linearity than the processes described above, while causing a large area due to low integration as well as high cost. Herein, a chip unit may be interpreted to mean the same as an integrated circuit unit or a package unit. Herein, the Group III-V compound semiconductor process may be for manufacturing a crystalline semiconductor including Group III elements (Al, Ga, In, etc.) and Group V elements (P, As, Sb, etc.) in the Periodic Table. In an example embodiment of the inventive concepts, the GaAs compound semiconductor process may be applied as described, but the inventive concepts are not limited thereto.

The transceiver 24 may include two or more integrated circuits manufactured in different semiconductor processes. For example, the combiner/divider 24_2, the mixer 24_6, and the LO generator 24_8 may be included in an integrated circuit manufactured in the CMOS process providing high integration, while the remaining elements of the transceiver 24 including the plurality of transmission chains TX_Chain and the plurality of reception chains RX_Chain may be included in an integrated circuit manufactured in a semiconductor process capable of providing higher performance. However, even in this case, the transceiver 24 may still have the advantages and disadvantages described above. Transmission chain TX_Chain, may require higher performance than the reception chain RX_Chain. When only the transmission chain TX_Chain is included in an integrated circuit manufactured in a semiconductor process different from the CMOS process (e.g., a III-V compound semiconductor process) it may be more difficult to integrate passive devices due to the limited number of layers and dielectric material. As a result, the integrated circuit including the transmission chain TX_Chain may be bloated.

According to an example embodiment, the transceiver 24 may be implemented as a second integrated circuit including a plurality of active devices AD and a first integrated circuit (also referred to as an RF chip herein) including the transmission chains TX_Chain, the reception chains RX_Chain, and the control circuits CC. The second integrated circuit may be manufactured in the semiconductor process providing higher performance than the CMOS process, such as the III-V compound semiconductor process, while the first integrated circuit may be manufactured in the CMOS process that provides high integration and low cost. Accordingly, the transceiver 24 may provide high usability while providing high performance.

Figure 3A:
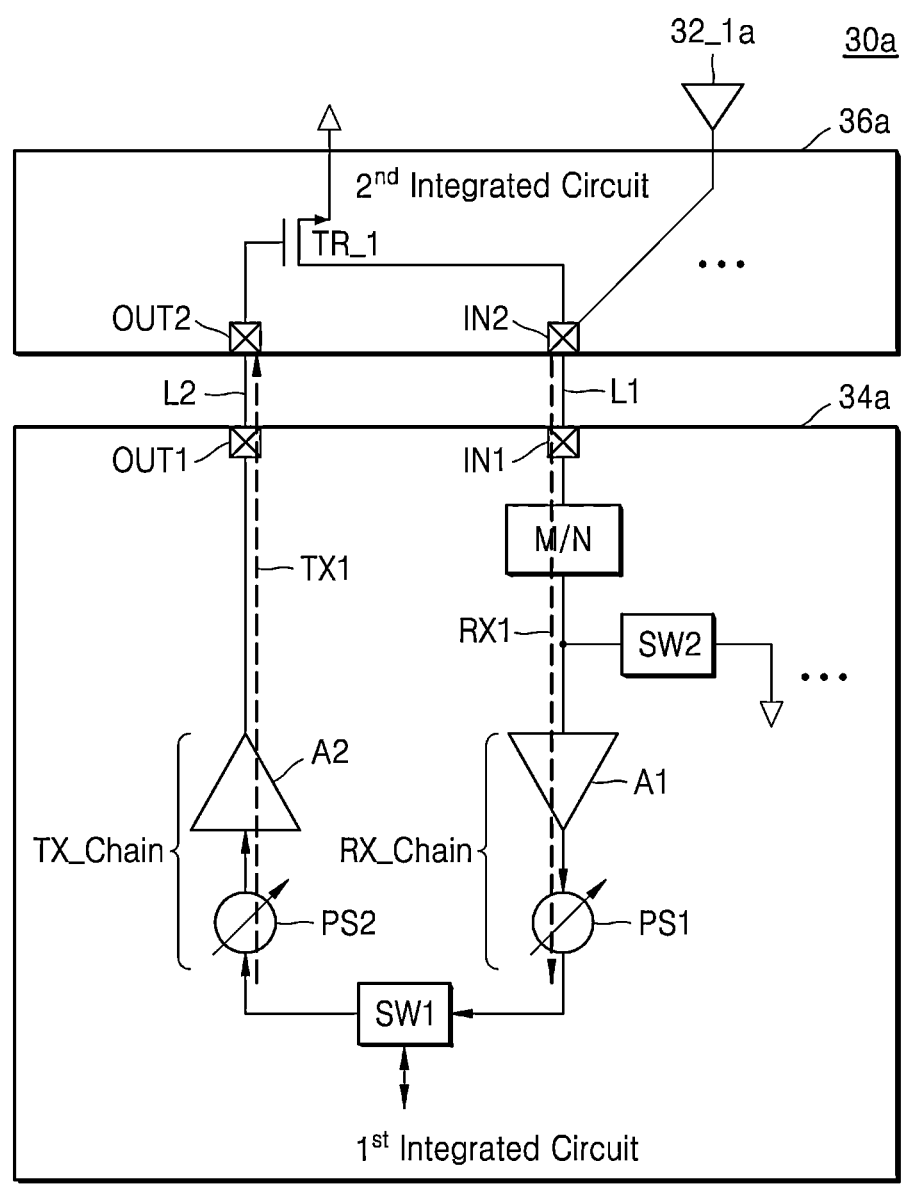
FIGS. 3A and 3B are block diagrams illustrating antenna modules according to an example embodiment.
Figure 3B:
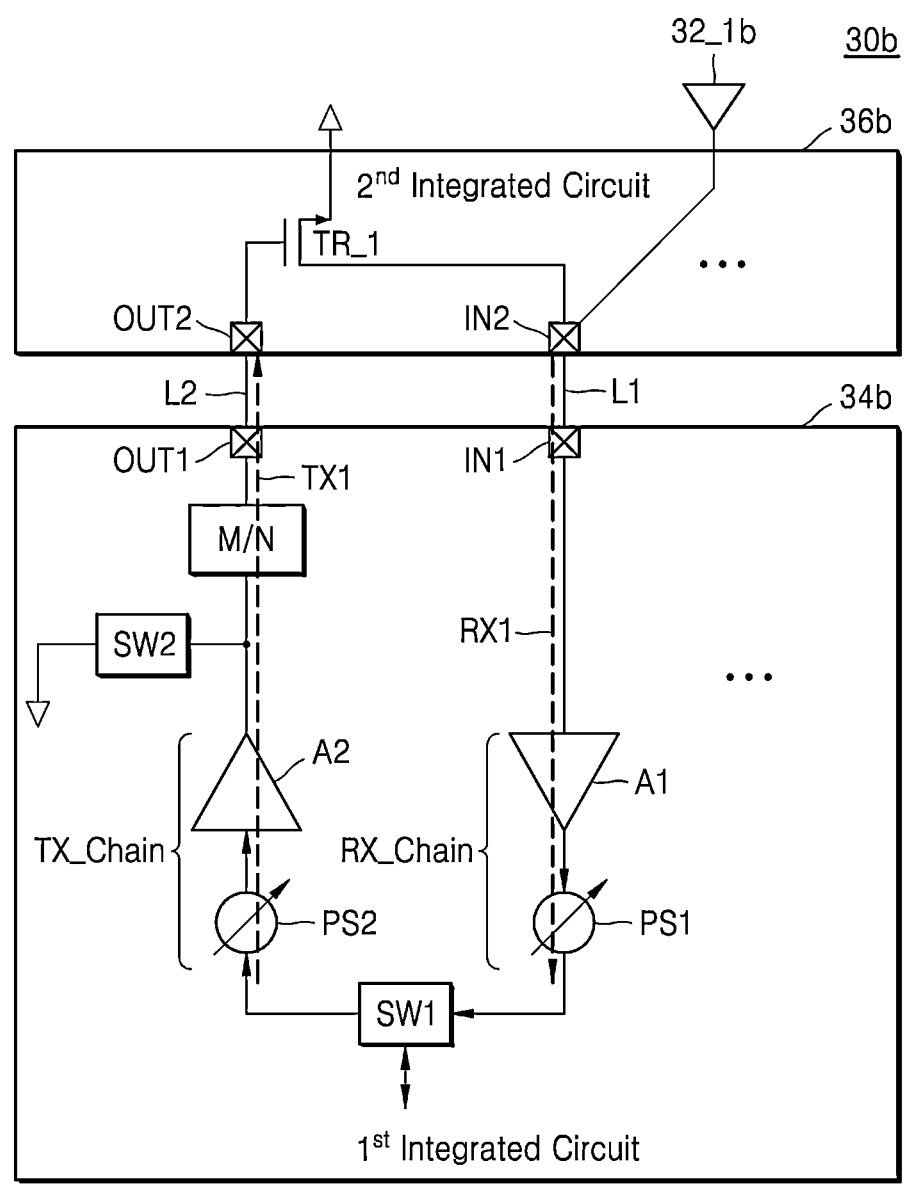

FIGS. 3A and 3B are diagrams illustrating antenna modules 30a and 30b according to example embodiments. Specifically, FIGS. 3A and 3B are block diagrams illustrating antennas 32_1a and 32_1b and circuits corresponding thereto in the antenna modules 30a and 30b. As described above with reference to FIGS. 2A and 2B, in FIGS. 3A and 3B, first integrated circuits 34a and 34b may be manufactured in a CMOS process. The second integrated circuits 36a and 36b may be manufactured in a semiconductor process that provides higher performance than the CMOS process, for example, a GaAs compound semiconductor process. Hereinafter, redundant descriptions given with reference to FIGS. 3A and 3B with those given with reference to FIGS. 2A and 2B are omitted.

Referring to FIG. 3A, the antenna module 30a may include the antenna 32_1a, the first integrated circuit 34a, and the second integrated circuit 36a. The first integrated circuit 34a may include the low noise amplifier A1 and the first phase shifter PS1 as the reception chain RX_Chain forming the first reception path RX1 in a reception mode. In an example embodiment, the reception chain RX_Chain may be connected to a second switch SW2 and selectively grounded according to a transmission mode or the reception mode. In addition, the reception chain RX_Chain may be connected to a matching network M/N. The circuit including the second switch SW2 and the matching network M/N may be the control circuit CC described above with reference to FIG. 2A. The first integrated circuit 34a may include the second phase shifter PS2 and the power amplifier A2 as the transmission chain TX_Chain forming the first transmission path TX1 in the transmission mode. The first integrated circuit 34a may include pins exposed to the outside for connection to the second integrated circuit 36a. For example, the first integrated circuit 34a may include a first input pin IN1 and a first output pin OUT1 for connection to the second integrated circuit 36a. The first integrated circuit 34a may include the first switch SW1, and may connect any one of the transmission chain TX_Chain and the reception chain RX_Chain to a combiner/divider (not shown) according to the transmission mode or the reception mode through the first switch SW1. In addition, the first integrated circuit 34a may be referred to as an RF chip or a Radio Frequency Integrated Circuit (RFIC).

The second integrated circuit 36a may include a transistor TR_1 as an active device. The second integrated circuit 36a may include a plurality of pins connected to terminals (or electrodes) of the transistor TR_1. The transistor TR_1 may be a high electron mobility transistor (HEMT) that uses a junction between materials (e.g., Ga and As) having different band gaps as a channel. This may allow the transistor TR_1 to drive a large current based on a small control signal and operate well at high frequency. Herein, the transistor TR_1 or the active device included in the second integrated circuit 36a may be referred to as a power cell. In an example embodiment, the second integrated circuit 36a may include an active device array including a plurality of active devices, such as the transistor TR_1. For example, the second integrated circuit 36a may include a second input pin IN2 and a second output pin OUT2 for connection to the first integrated circuit 34a. A gate terminal of the transistor TR_1 may be connected to the second output pin OUT2, a drain terminal thereof may be connected to the second input pin IN2, and a source terminal thereof may be grounded. However, this is only an example embodiment, and in some embodiments, the gate terminal of the transistor TR_1 may be connected to the second input pin IN2, the drain terminal thereof may be connected to the second output pin OUT2, and the source terminal thereof may be grounded. Although the antennas 32_1a and 32_1b are directly connected to the second input pin IN2 in FIGS. 3A and 3B, this is an example embodiment and is not limited thereto. The second integrated circuit 36a may further include a separate input/output pin (not shown), and the antennas 32_1a and 32_1b may be directly connected to the input/output pin (not shown). In this case, the input/output pin (not shown) may be connected to the second input pin IN2 through a certain conductive line in the second integrated circuit 36a.

In an example embodiment, the transistor TR_1 may amplify a first RF signal received from the transmission chain TX_Chain through the second output pin OUT2 in the transmission mode and output the first RF signal to the antenna 32_1a. Specifically, the transistor TR_1 may generate drain current corresponding to the first RF signal applied to the gate terminal thereof and output an RF signal having power matching the drain current to the antenna 32_1a. In an example embodiment, the transistor TR_1 may output a second RF signal received from the antenna 32_1a in the reception mode to the first integrated circuit 34a through the second input pin IN2. The reception chain RX_Chain of the first integrated circuit 34a may receive the second RF signal through the first input pin IN1.

In FIG. 3A, the transistor TR_1 may be implemented as an n-channel metal oxide semiconductor (nMOS) transistor, but this is only an example embodiment, and is not limited thereto. The transistor TR_1 may be implemented as various types of transistors such as a p-channel MOS (pMOS) transistor, a field effect transistor (FET), etc.

The second input pin IN2 may be connected to the first input pin IN1 through the first conductive line L1, and the second output pin OUT2 may be connected to the first output pin OUT1 through the second conductive line L2. Herein, a conductive line may be referred to as a pattern.

In an example embodiment, the reception chain RX_Chain may be grounded through the second switch SW2 in the transmission mode, and as a result, the reception chain RX_Chain may be deactivated. The reception chain RX_Chain may not be grounded through the second switch SW2 in the reception mode, and as a result, the reception chain RX_Chain may be activated.

In an example embodiment, the matching network M/N may include a plurality of passive devices, may be provided to the transmission chain TX_Chain in the transmission mode, and may be provided to the reception chain RX_Chain in the reception mode. A specific embodiment in this regard will be described later.

Referring further to FIG. 3B, unlike the first integrated circuit 34a of FIG. 3A, in the first integrated circuit 34b, the matching network M/N and the second switch SW2 may be connected to the transmission chain TX_Chain. In an example embodiment, the transmission chain TX_Chain may be grounded through the second switch SW2 in the reception mode, and as a result, the transmission chain TX_Chain may be deactivated. The transmission chain TX_Chain may not be grounded through the second switch SW2 in the transmission mode, and as a result, the transmission chain TX_Chain may be activated. In addition, the matching network M/N may be provided to the transmission chain TX_Chain in the transmission mode, and may be provided to the reception chain RX_Chain in the reception mode in the same manner as in FIG. 3A.

Referring back to FIG. 3A, the transmission chain TX_Chain and the reception chain RX_Chain may be connected to an active device such as the transistor TR_1, in the transmission mode, the reception chain RX_Chain may be grounded by the second switch SW2, and the transistor TR_1 may amplify the first RF signal received from the transmission chain TX_Chain and output the first RF signal through the antenna 32_1a, and, in the reception mode, the transistor TR_1 may output the second RF signal received through the antenna 32_1a to the reception chain RX_Chain.

According to an example embodiment, the second integrated circuit 36a directly connected to the antenna 32_1a may be manufactured in a higher cost process than a process with respect to the first integrated circuit 34a to ensure high performance.

Figure 4:
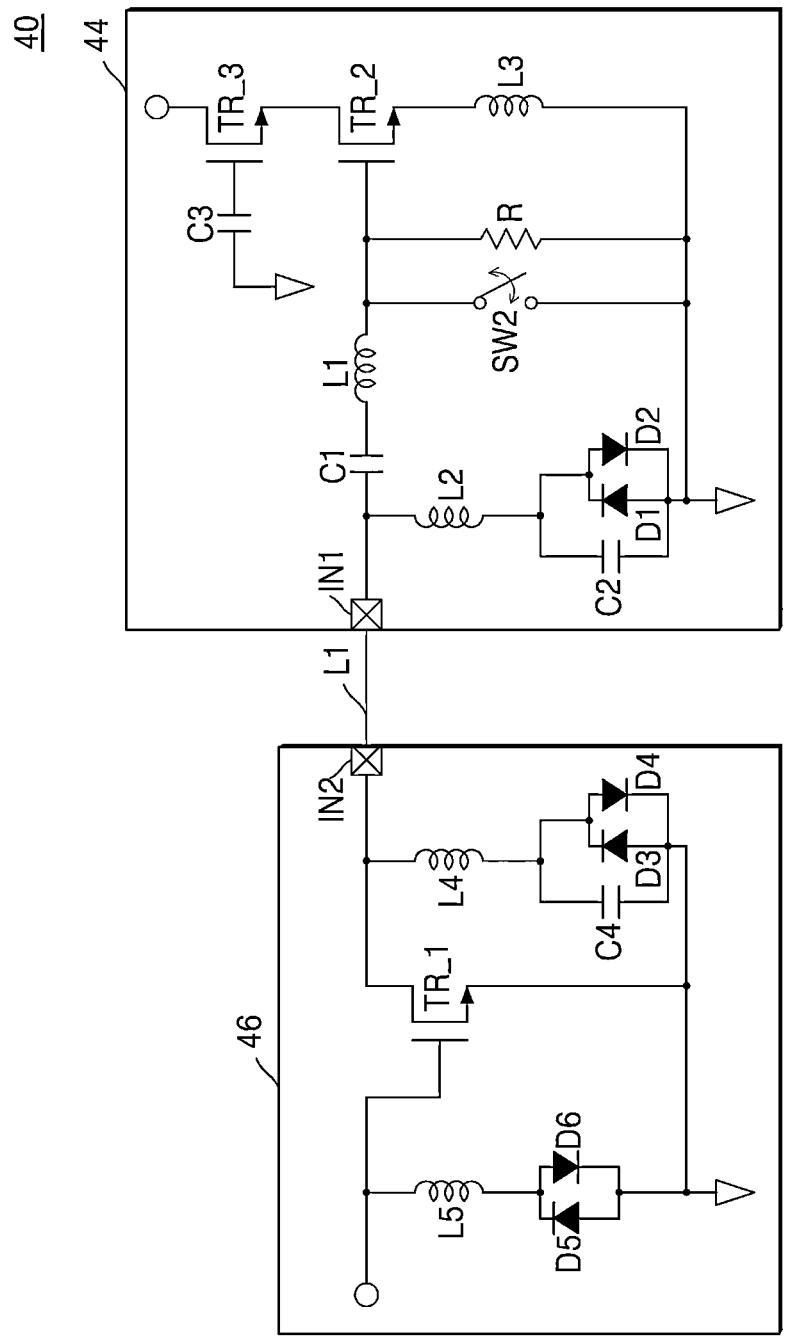
FIG. 4 is a circuit diagram of an antenna module according to an example embodiment.

FIG. 4 is a circuit diagram of an antenna module 40 according to an example embodiment. FIG. 4 illustrates an implementation of the antenna module 40 conforming to the configuration of the antenna module 30a shown in FIG. 3A, and the configuration of a reception chain is illustrated in detail in a first integrated circuit 44.

Referring to FIG. 4, the antenna module 40 may include the first integrated circuit 44 and a second integrated circuit 46. The first integrated circuit 44 may include a first input pin IN1, a first inductor L1, a second inductor L2, a third inductor L3, a first capacitor C1, a second capacitor C2, a third capacitor C3, a first diode D1, a second diode D2, the second switch SW2, a resistor R, a second transistor TR_2, and a third transistor TR_3, which may constitute the reception chain.

The first input pin IN1 may be connected to the reception chain of the first integrated circuit 44. The first capacitor C1 may be connected in series to the first inductor L1, and the second inductor L2 may be connected in parallel to the first inductor L1. The second inductor L2 may be connected in series to the second capacitor C2, the first diode D1, and the second diode D2 that are connected to each other in parallel. The first capacitor C1, the first inductor L1, and the second inductor L2 may constitute a matching network, and each may be set to have capacitance or inductance associated with the second integrated circuit 46. For example, the matching network may be provided to a transmission chain of the first integrated circuit 44 in a transmission mode, and may be provided to the reception chain of the first integrated circuit 44 in a reception mode. A detained description in this regard will be given below. The second capacitor C2, the first diode D1, and the second diode D2 may constitute a first electrostatic discharge (ESD) protection circuit for preventing ESD at the first integrated circuit 44 side. The second switch SW2 may be connected in parallel to the second inductor L2 to selectively ground the reception chain. The resistor R may be connected in parallel to the second switch SW2. The second transistor TR_2 and the third transistor TR_3 may be cascade connected to each other. A gate terminal of the second transistor TR_2 may be connected to the first inductor L1, a source terminal thereof may be connected to the third inductor L3, and a drain terminal thereof may be connected to a source terminal of the third transistor TR_3. A gate terminal of the third transistor TR_3 may be connected to the third capacitor C3, and a drain terminal thereof may be connected to another configuration included in the reception chain. The second transistor TR_2, the third transistor TR_3, the third inductor L3, and the third capacitor C3 may constitute a low noise amplifier of the first integrated circuit 44. In an example embodiment, the above low noise amplifier may be turned off (or deactivated) in the transmission mode and turned on (or activated) in the reception mode.

The second integrated circuit 46 may include the second input pin IN2, a fourth inductor L4, a fifth inductor L5, a fourth capacitor C4, a third diode D3, a fourth diode D4, a fifth diode D5, a sixth diode D6, and the first transistor TR_1. The first transistor TR_1 may correspond to the above-described active device.

The second input pin IN2 may be connected to the gate terminal of the first transistor TR_1. The fourth inductor L4 may be connected to the gate terminal of the first transistor TR_1 and may be connected in series to the fourth capacitor C4, the third diode D3, and the fourth diode D4 that are connected to each other in parallel. A source terminal of the first transistor TR_1 may be grounded, and the gate terminal of the first transistor TR_1 may be connected to the fifth inductor L5. Although not shown in FIG. 4, the gate terminal of the first transistor TR_1 may be connected to a second output pin (not shown) included in the second integrated circuit 46. The second output pin (not shown) may be connected to a transmission chain (not shown) of the first integrated circuit 44. The fifth inductor L5 may be connected in series to the fifth diode D5 and the sixth diode D6 that are connected to each other in parallel. The fourth inductor L4 may be set to have an inductance associated with the first transistor TR_1 and the matching network (e.g., the first capacitor C1, the first inductor L1, and the second inductor L2) of the first integrated circuit 44. The fourth capacitor C4, the third diode D3, and the fourth diode D4 may constitute a second ESD protection circuit for preventing ESD from the second integrated circuit 46. For example, the fourth diode D4 may be a forward triple stacked diode, the third diode D3 may be a reverse single diode, and the fourth capacitor C4 may be a DC decoupling capacitor. A circuit including the fifth inductor L5, the fifth diode D5, and the sixth diode D6 may be used to maintain an input bandwidth of the first transistor TR_1 and to separate a signal of a millimeter wave band.

In an example embodiment, a process with respect to each of the first integrated circuit 44 and the second integrated circuit 46 may be different. For example, the first integrated circuit 44 may be manufactured in a CMOS process, and the second integrated circuit 46 may be manufactured in a GsAs semiconductor process. Accordingly, the performance of the first transistor TR_1 may be better than those of the second transistor TR_2 and the third transistor TR_3.

The circuit diagram of the antenna module 40 shown in FIG. 4 is only an example embodiment, and is not limited thereto. Various circuit examples may be applied to a second integrated circuit including an active device connected to an antenna, and a first integrated circuit including a transmission chain and a reception chain.

Figure 5A:
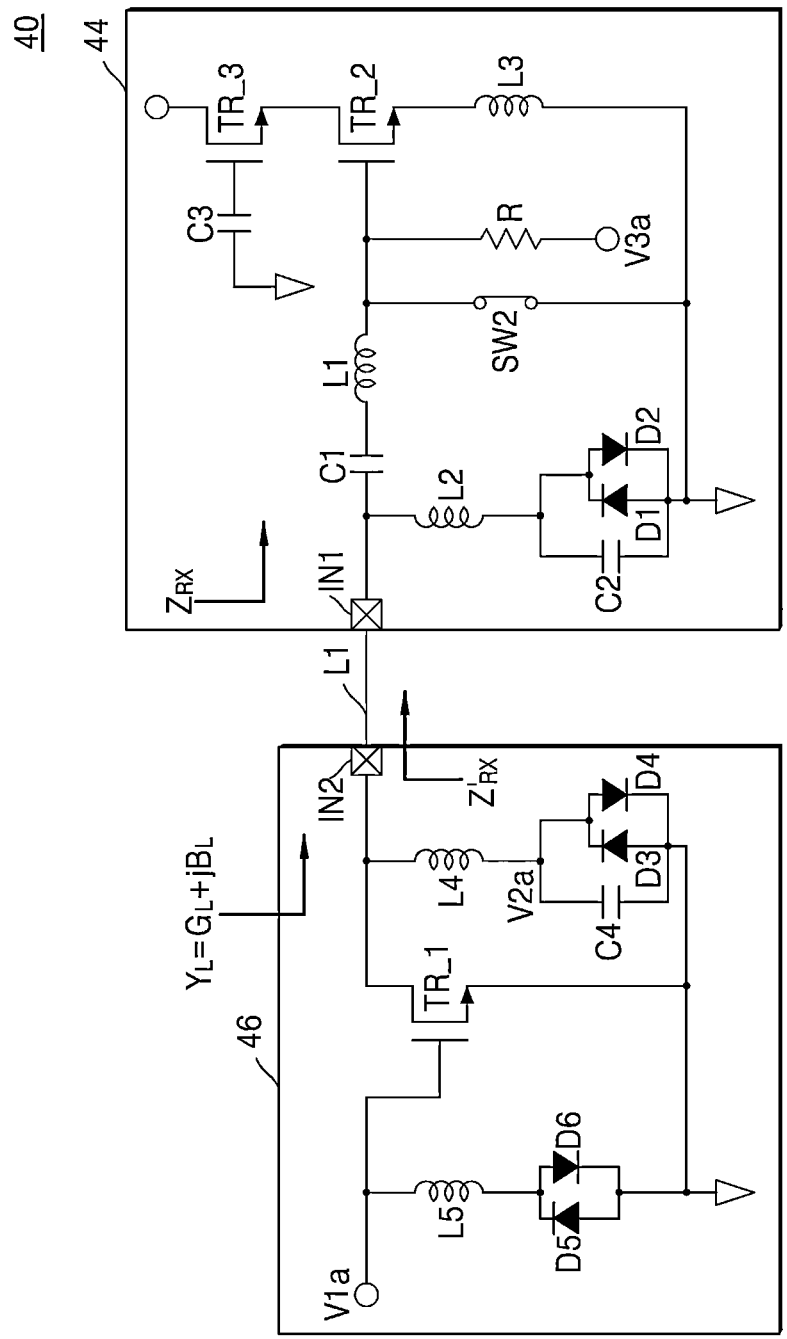
FIGS. 5A to 5E are diagrams illustrating a design method of a first integrated circuit and a second integrated circuit according to an example embodiment.

FIGS. 5A to 5E are diagrams illustrating a design method of the first integrated circuit 44 and the second integrated circuit 46 according to an example embodiment. FIG. 5A assumes the antenna module 40 is in a transmission mode. Hereinafter, redundant descriptions between FIG. 5A and FIG. 4 are omitted.

Referring to FIG. 5A, a first bias voltage V1a may be applied to a gate terminal of the first transistor TR_1 in response to the transmission mode, a second bias voltage V2a may be applied to a node between the fourth inductor L4 and the fourth capacitor C4, and a third bias voltage V3a may be applied to a resistor R. For example, the first bias voltage V1a may be 0.6 V, the second bias voltage V2a may be 3 V, and the third bias voltage V3a may be 0 V. As described above, a first RF signal may be additionally applied to the gate terminal of the first transistor TR_1 together with the first bias voltage V1a.

In an example embodiment, the fourth capacitor C4 may block turning-on the fourth diode D4 in an output voltage swing of the first RF signal of a millimeter wave band added to the second bias voltage V2a. The fourth inductor L4 may separate the first RF signal of the millimeter wave band from the fourth diode D4 having a large parasitic capacitance. The third diode D3 and the fourth diode D4 may prevent ESD.

In an example embodiment, the second inductor L2 may be a shunt inductor separating the first diode D1 and the second diode D2 for ESD prevention from the first RF signal of the millimeter wave band, and included in a matching network through the second capacitor C2.

The second input pin IN2 may be directly connected to an antenna or may be connected to the antenna through an input/output pin included in the second integrated circuit 46. An admittance $Y_L$ in a direction of the antenna in the second input pin IN2 may be determined as the sum (or difference) of a conductance $G_L$ of a real part and a susceptance $B_L$ of an imaginary part. The admittance $Y_L$ may be determined according to [Equation 1].

$$Y_L = 1/(50\Omega/j\omega L_4//Z'_{RX}) \qquad \text{[Equation 1]}$$

The admittance $Y_L$ may be determined as a reciprocal number of a parallel connection operation result between a resistance value 50 ($\Omega$) of the antenna, a reactance $j\omega L_4$, of the fourth inductor L4, and a first impedance $Z'_{RX}$ from the second input pin IN2 to the first integrated circuit 44. The first impedance $Z'_{RX}$ may be determined from a second impedance of the first conductive line L1 between the first input pin IN1 and the second input pin IN2 and a third impedance $Z_{RX}$ from the input pin IN1 of the first integrated circuit 44 to the reception chain.

Figure 5B:
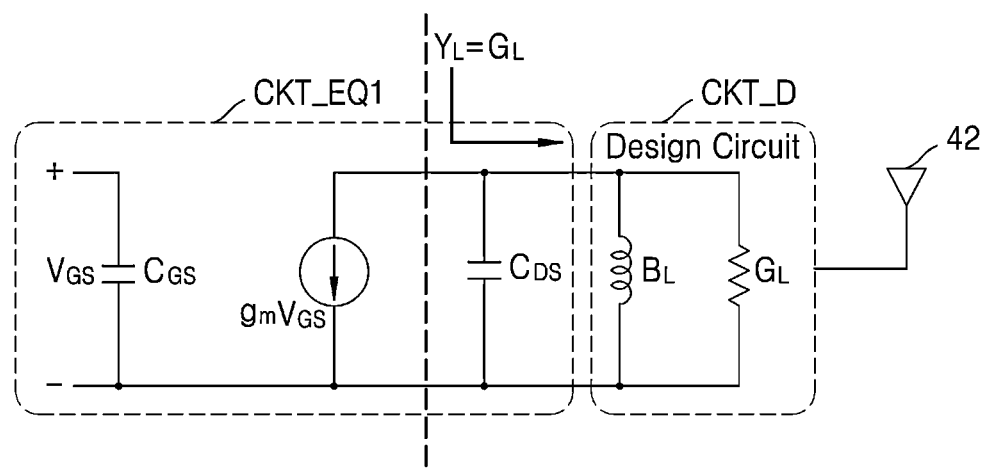

Referring further to FIG. 5B, a small signal equivalent circuit CKT_EQ1 of the first transistor TR_1 may include a first equivalent capacitor $C_{GS}$, a second equivalent capacitor $C_{DS}$, and an equivalent current source $gmV_{GS}$. The first equivalent capacitor $C_{GS}$ may have a capacitance value between the gate terminal and the source terminal of the first transistor TR_1, and the second equivalent capacitor $C_{DS}$ may have a capacitance value between the drain terminal and the source terminal of the first transistor TR_1. A gate-source voltage $V_{GS}$ may be applied to the first equivalent capacitor $C_{GS}$.

Also, a design circuit CKT_D may be a simplified representation of a circuit including the first inductor L1, the second inductor L2, the fourth inductor L4, and the capacitor C1 of FIG. 5A. That is, the first inductor L1, the second inductor L2, the fourth inductor L4, and the capacitor C1 may be expressed as an inductor having the certain susceptance $B_L$ and a resistor having the certain conductance $G_L$ that are connected in parallel to each other.

In an example embodiment, the susceptance $B_L$ in the design circuit CKT_D may have a value such that a capacitance component of the second equivalent capacitor $C_{DS}$ of the small signal equivalent circuit CKT_EQ1 may be removed. Accordingly, the admittance $Y_L$ may correspond to the certain conductance $G_L$. Hereinafter, the certain conductance $G_L$ is described with reference to FIG. 5C.

Figure 5C:
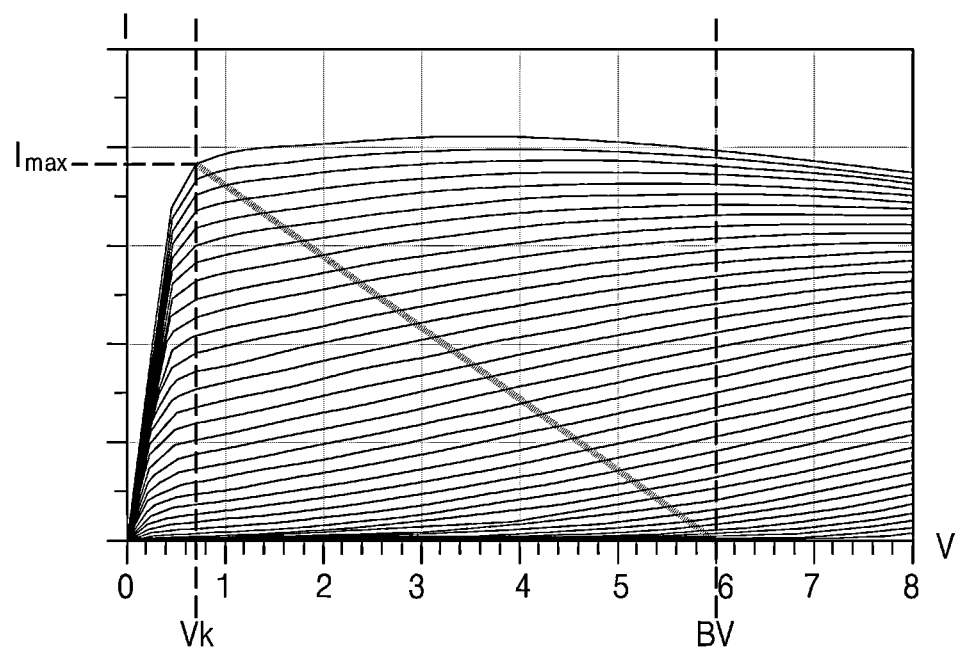

Further referring to FIG. 5C, the first transistor TR_1 may have a current-voltage (I-V) curve characteristic according to bias voltages. The conductance $G_L$ may be determined such that the first transistor TR_1 may have design target power, high linearity, and a wide swing range. For example, the conductance $G_L$ may be determined from a voltage swing between a knee voltage Vk and a breakdown voltage BV and a current swing between a maximum current $I_{max}$ and zero current. That is, the conductance $G_L$ may be determined from [Equation 2].

$$G_L = \frac{I_{max}}{BV - Vk}$$

$I_{max}$ denotes the maximum current, and the conductance $G_L$ may be determined as a value obtained by dividing the maximum current $I_{max}$ by a difference between the breakdown voltage BV and the knee voltage Vk.

Returning to FIG. 5A, inductances of the first impedance Z'RX and the fourth inductor L4 matching the determined susceptance $B_L$ and the determined conductance $G_L$ may be designed. Also, each of the first inductor L1, the second inductor L2, and the capacitor C1 of FIG. 5B may be designed to have inductance or capacitance matching the first impedance $Z'_{RX}$. Hereinafter, the first impedance $Z'_{RX}$ is described with reference to FIG. 5D.

Figure 5D:
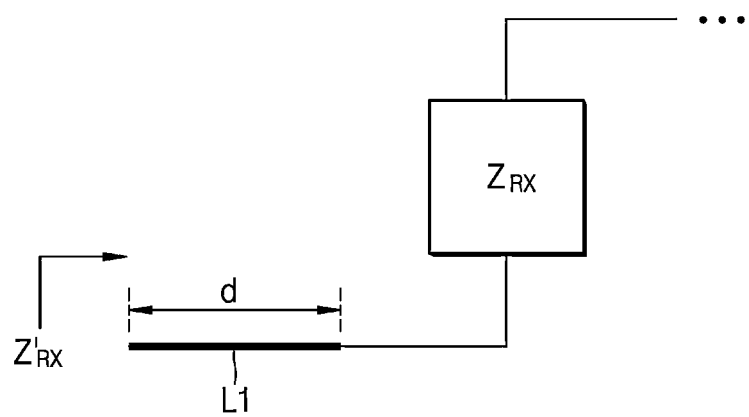

Further referring to FIG. 5D, the first impedance $Z'_{RX}$ may be determined from the second impedance and the third impedance $Z_{RX}$ of the first conductive line L1. That is, the first impedance $Z'_{RX}$ may be determined from [Equation 3].

$$Z'_{RX} = Z_0 \frac{Z_{RX} + jZ_0 \tan(\beta d)}{Z_0 + jZ_{RX} \tan(\beta d)} \quad \text{[Equation 3]}$$

$$\beta = \frac{\lambda}{2\pi}$$

$Z_0$ may denote the second impedance of the first conductive line L1, and $\lambda$ may denote a wavelength of the first RF signal. In addition, the third impedance ZRX in FIG. 5A may be determined from [Equation 4].

$$Z_{RX} = j\omega L_2 // (j\omega L_1 + R_{ON}) \quad \text{[Equation 4]}$$

The third impedance $Z_{Rx}$ may be determined as a result of a parallel connection operation between a reactance $j\omega L_2$ of the second inductor L2 and the sum of a reactance $j\omega L_1$ of the first inductor L1 and an on-resistance $R_{ON}$ of the second switch SW2. Herein, it is assumed that the reactance of the first capacitor C1 is designed to be sufficiently less than the reactance $j\omega L_1$ of the first inductor L1. Hereinafter, a design example of the second integrated circuit 46 and effects thereof are described with reference to FIG. 5E.

Figure 5E:
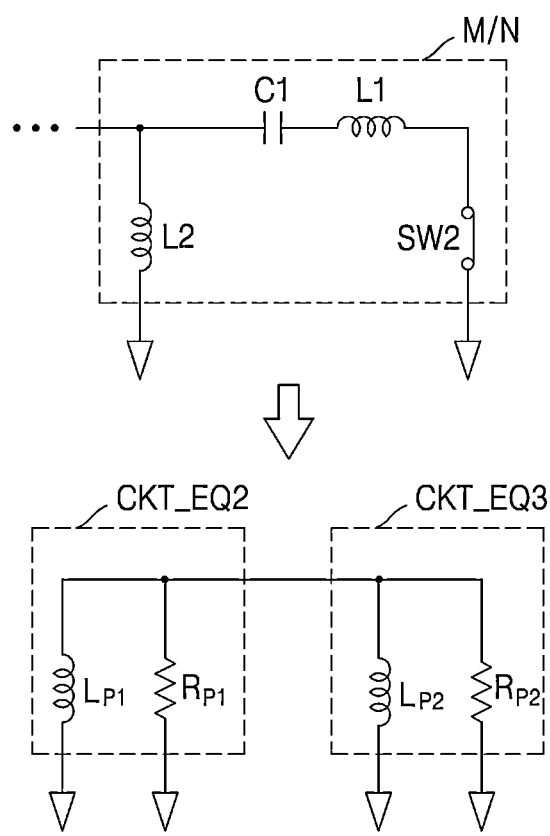

Further referring to FIG. 5E, the matching network M/N of the first integrated circuit 44 may include the first inductor L1, the second inductor L2, and the first capacitor C1. When the first integrated circuit 44 is implemented in a CMOS process, a quality (Q) factor representing the frequency selection characteristic of the matching network M/N may be low due to loss of the first inductor L1, the second inductor L2, etc.

The second equivalent circuit CKT_EQ2, which is an equivalent circuit of the matching network M/N, may include a first equivalent inductor $L_{P1}$ and a first equivalent resistor $R_{P1}$ connected in parallel to each other, and the third equivalent circuit CKT_EQ3, which is an equivalent circuit of the second integrated circuit 46 viewed from the first integrated circuit 44 toward the second integrated circuit 46, may include a second equivalent inductor $L_{P2}$ and a second equivalent resistor $R_{P2}$. For example, when the second integrated circuit 46 is implemented using a GaAs semiconductor process, the second equivalent inductor $L_{P2}$ and the second equivalent resistor $R_{P2}$ may have a high Q factor. The third equivalent circuit CKT_EQ3 may be connected to the second equivalent circuit CKT_EQ2 to compensate for the Q factor. That is, the second integrated circuit 46 may be designed to compensate for the Q factor of the matching network M/N of the first integrated circuit 44.

Figure 6A:
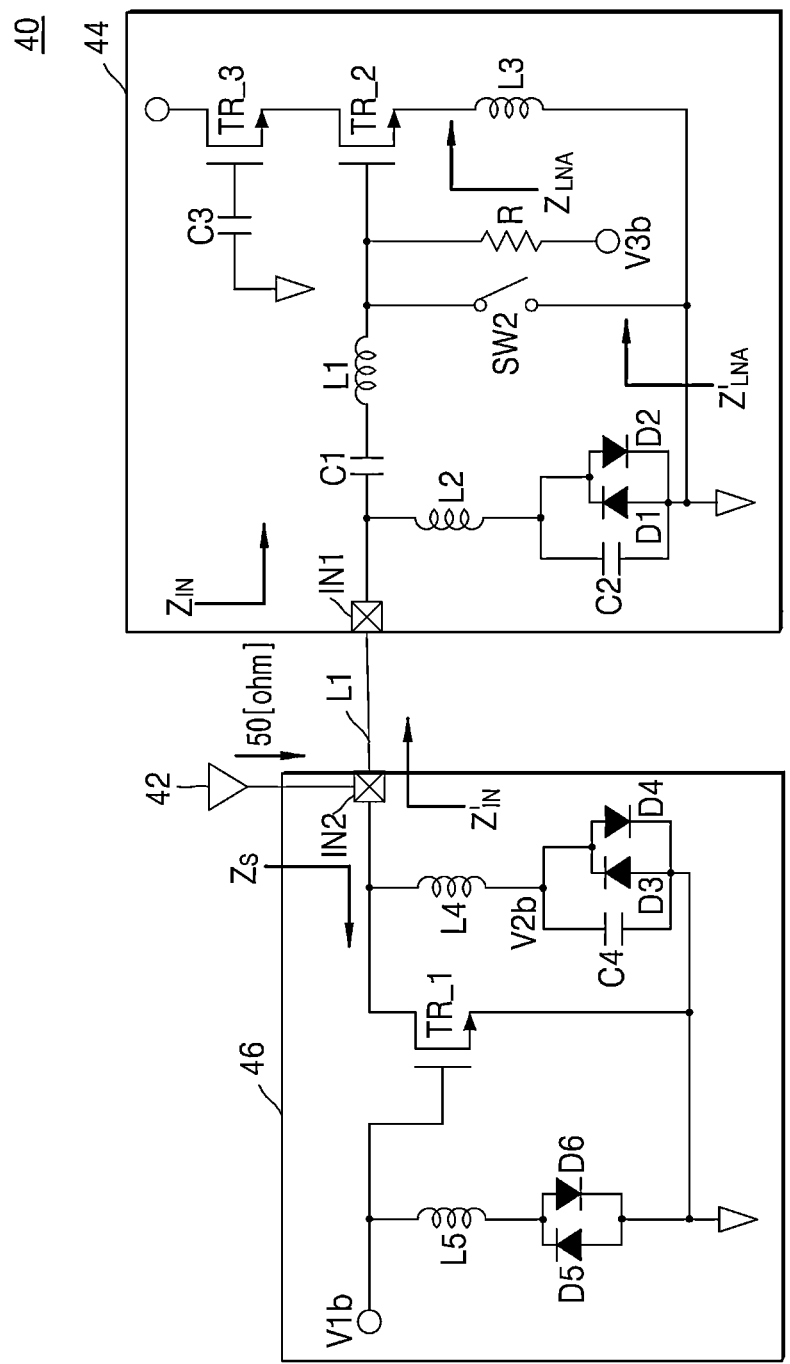
FIGS. 6A to 6C are diagrams illustrating a design method of a first integrated circuit and a second integrated circuit according to an example embodiment.
Figure 6B:
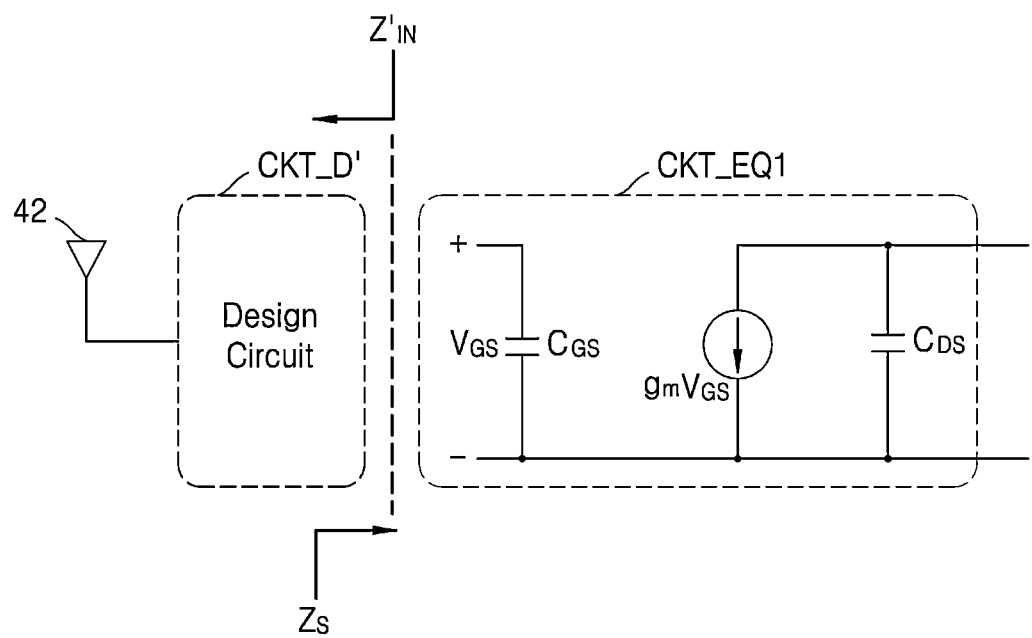
Figure 6C:
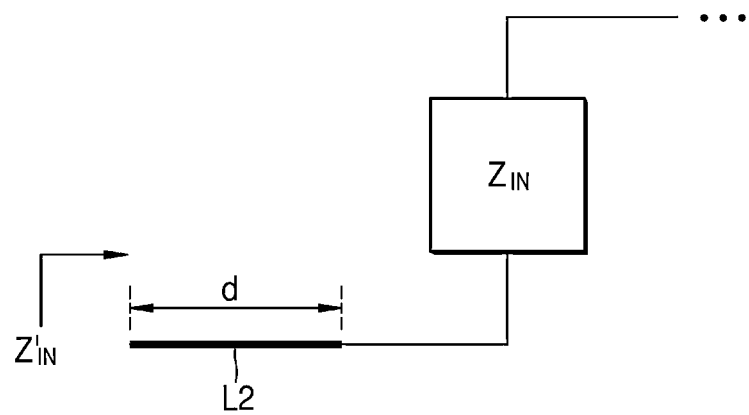

FIGS. 6A to 6C are diagrams illustrating a design method of the first integrated circuit 44 and the second integrated circuit 46 according to an example embodiment. FIG. 6A assumes the antenna module 40 is in a reception mode. Hereinafter, redundant descriptions between FIG. 6A and FIGS. 4A and 5A are omitted.

Referring to FIG. 6A, a first bias voltage V1b may be applied to a gate terminal of the first transistor TR_1 in response to the reception mode, a second bias voltage V2b may be applied to a node between the fourth inductor L4 and the fourth capacitor C4, and a third bias voltage V3b may be applied to the resistor R. For example, the first bias voltage V1b may be 0 V, the second bias voltage V2b may be 1 V, and the third bias voltage V3b may be 0.6 V. As described above, a second RF signal may be applied to a drain terminal of the first transistor TR_1 from an antenna 42.

In an example embodiment, for impedance matching with the antenna 42 in the reception mode, [Equation 5] associated with 50 ($\Omega$), which is a resistance value of the antenna 42, is as follows.

$$50(\Omega) = Z'_{IN} // Z_S \quad \text{[Equation 5]}$$

The impedance of the antenna 42 may be determined as a result of a parallel connection operation between a fourth impedance $Z'_{IN}$ from the second integrated circuit 46 to the first integrated circuit 44 and a fifth impedance $Z_S$ from the second input pin IN2 to the first transistor TR_1.

Further referring to FIG. 6B, the small-signal equivalent circuit CKT_EQ1 of the first transistor TR_1 may include a first equivalent capacitor $C_{GS}$, a second equivalent capacitor $C_{DS}$, and an equivalent current source $gmV_{GS}$. In addition, a design circuit CKT_D' may include the above-described matching network of the first integrated circuit 44 and the fourth inductor L4 of the second integrated circuit 46. In the reception mode, values of elements included in the design circuit CKT_D' may be determined so that the fourth impedance $Z'_{IN}$ and the fifth impedance $Z_S$ have the same value for impedance matching with the antenna 42.

Further referring to FIG. 6C, the fourth impedance $Z'_{IN}$ may be determined from a sixth impedance and a seventh impedance $Z_{IN}$ of the second conductive line L2. That is, the fourth impedance $Z'_{IN}$ may be determined from [Equation 6].

$$Z'_{IN} = Z_0 \frac{Z_{IN} + jZ_0 \tan(\beta d)}{Z_0 + jZ_{IN} \tan(\beta d)} \quad \text{[Equation 6]}$$

$$\beta = \frac{\lambda}{2\pi}$$

$Z_0$ may denote the sixth impedance of the second conductive line L2, and $\lambda$ may denote a wavelength of the second RF signal. In addition, the seventh impedance $Z_{IN}$ in FIG. 6A may be determined from [Equation 7].

$$Z_{IN} = (Z'_{LNA} + j\omega L_1) // (j\omega L_2) \quad \text{[Equation 7]}$$

The seventh impedance $Z_{IN}$ may be determined as a result of a parallel connection operation between the sum of an eighth impedance $Z'_{LNA}$ toward a low noise amplifier including the second transistor TR_2 and the third transistor TR_3 and the reactance $j\omega L_1$ of the first inductor L1 and the reactance $j\omega L_2$ of the second inductor L2. The eighth impedance $Z'_{LNA}$ may be determined from [Equation 8].

$$Z'_{LNA} = Z_{LNA} // (1/j\omega C_{OFF1}) \qquad \text{[Equation 8]}$$

The eighth impedance $Z'_{LNA}$ may be determined as a result of a parallel connection operation between a ninth impedance $Z_{LNA}$ of the low noise amplifier including the second transistor TR_2 and the third transistor TR_3 and a tenth impedance $1/j\omega C_{OFF1}$ reflecting a capacitance $C_{OFF1}$ of the second switch SW2 that is turned off. The ninth impedance $Z_{LNA}$ may be determined from [Equation 9].

$$Z_{LNA} = j\omega L_3 + 1/j\omega C'_{GS} + g_m L_3/C'_{GS}) \qquad \text{[Equation 9]}$$

The ninth impedance $Z_{LNA}$ may be determined as the sum of the tenth impedance $j\omega L_3$ of the third inductor L3, an eleventh impedance $1/j\omega C'_{GS}$ reflecting a capacitance $C'_{GS}$ between the gate and source of the second transistor TR_2, a characteristic $g_m$ of the second transistor TR_2, the inductance $L_3$ of the third inductor L3, and a twelfth impedance $g_m L_3/C'_{GS}$ resulting from the capacitance $C'_{GS}$ between the gate and source of the second transistor TR_2.

According to an example embodiment, values of the elements of the design circuits CKT_D and CKT_D' in FIGS. 5B and 6B may be determined based on the above-described equations.

Figure 7:
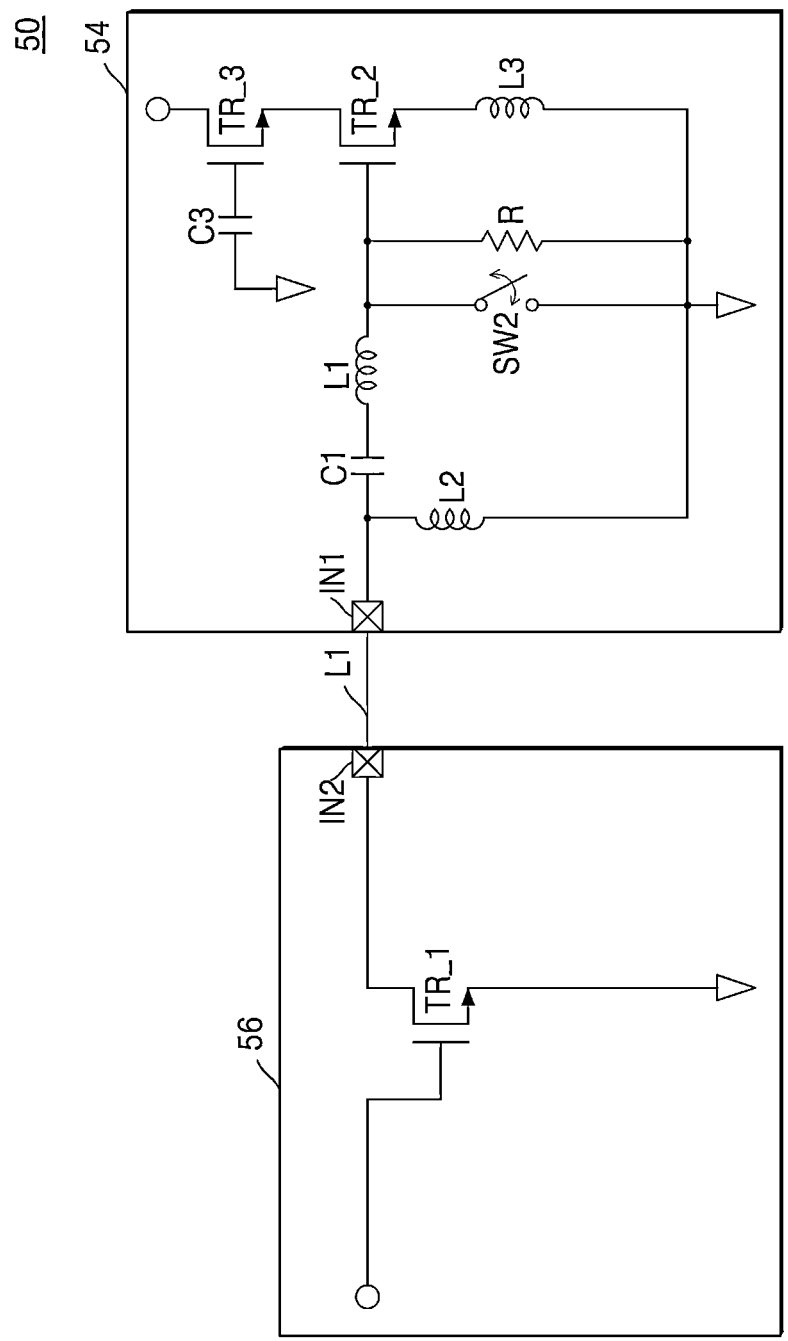
FIG. 7 is a circuit diagram of an antenna module according to an example embodiment.

FIG. 7 is a circuit diagram of an antenna module 50 according to an example embodiment. FIG. 7 illustrates an implementation of the antenna module 50 conforming to the configuration of the antenna module 30a shown in FIG. 3A, and the configuration of a reception chain is intensively illustrated in a first integrated circuit 54. Hereinafter, compared to the antenna module 40 of FIG. 4, different configurations are described.

Referring to FIG. 7, the antenna module 50 may include the first integrated circuit 54 and a second integrated circuit 56. The first integrated circuit 54 may include the first input pin IN1, the first inductor L1, the second inductor L2, the third inductor L3, the first capacitor C1, the third capacitor C3, the second switch SW2, the resistor R, the second transistor TR_2, and the third transistor TR_3, which may constitute the reception chain. Compared to FIG. 4, a first ESD protection circuit including the second capacitor C2, the first diode D1, and the second diode D2 may be omitted in the first integrated circuit 54.

The second integrated circuit 56 may include the second input pin IN2 and the first transistor TR_1. The first transistor TR_1 may correspond to the above-described active device. Compared to FIG. 4, in the second integrated circuit 56, a second ESD protection circuit including the fourth capacitor C4, the third diode D3 and the fourth diode D4 may be omitted, and a circuit including the fifth inductor L5, the fifth diode D5 and the sixth diode D6 may be omitted.

In an example embodiment, the first capacitor C1, the first inductor L1, and the second inductor L2 constituting a matching network of the first integrated circuit 54 may be provided to a transmission chain or a reception chain of the first integrated circuit 54 according to an operation mode and each may be set to have capacitance or inductance to achieve impedance matching with an antenna. In an example embodiment, the first capacitor C1, the first inductor L1, and the second inductor L2 may be designed based on the equations described above with reference to FIGS. 5A to 6C.

Figure 8:
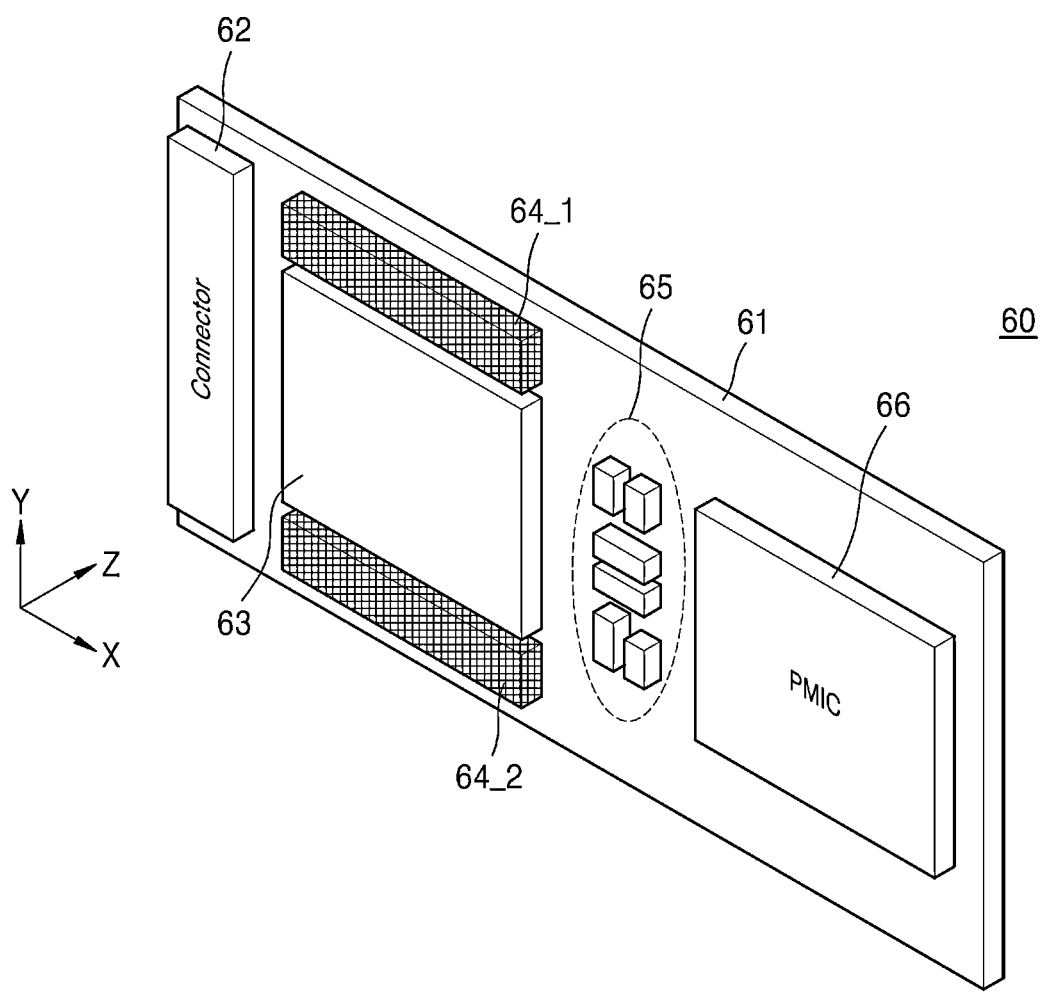
FIG. 8 illustrates an antenna module according to an example embodiment.

FIG. 8 shows an antenna module 60 according to an example embodiment. Specifically, FIG. 8 is a perspective view illustrating the antenna module 60 including two second integrated circuits 64_1 and 64_2. Hereinafter, a Z-axis direction may be referred to as a vertical direction, an element disposed in a +Z-axis direction rather than another element may be referred to as being above the other element, and an element disposed in a −Z-axis direction rather than another element may be referred to as being below the other element. In addition, among surfaces of an element, a surface exposed in the +Z axis direction may be referred to as an upper surface of the element, a surface exposed in the −Z axis direction may be referred to as a lower surface of the component, and a surface exposed in a direction perpendicular to the Z-axis may be referred to as a side face of the element.

Referring to FIG. 8, the antenna module 60 may include a multi-layer substrate 61, and may include a connector 62, a first integrated circuit 63, the second integrated circuits 64_1 and 64_2, discrete devices 65, and a power management integrated circuit (PMIC) 66 on a lower surface of the multi-layer substrate 61. As described above, the first integrated circuit 63 may be referred to as an RF chip, and the second integrated circuits 64_1 and 64_2 may be referred to as active arrays.

The multi-layer substrate 61 may include a plurality of layers, and each of the plurality of layers may include the same or different materials, as described below with reference to FIG. 9, and the plurality of layers may include conductive layers. In some embodiments, the multi-layer substrate 61 may be a printed circuit board (PCB). The multi-layer substrate 61 may include an antenna including a pattern formed on at least one layer, and the antenna may be configured to transmit and receive electromagnetic waves through an upper surface of the multi-layer substrate 61, that is, in the Z-axis direction. In addition, the multi-layer substrate 61 may include a pattern for connecting the second integrated circuits 64_1 and 64_2 and antennas, and may include a pattern for connecting the first integrated circuit 63 to the second integrated circuits 64_1 and 64_2.

The connector 62 may be connected to a cable and/or another connector and may provide an interface between the antenna module 60 and an external component. For example, the connector 62 may receive a voltage and/or current for supplying power to the antenna module 60 and transmit the voltage and/or current to the PMIC 66 of the antenna module 60. In addition, the connector 62 may transmit a signal (e.g., S_IF1 in FIG. 1) received from the outside to the first integrated circuit 63, and may output a signal (e.g., S_IF1 in FIG. 1) provided from the first integrated circuit 63 to the outside.

Each of the second integrated circuits 64_1 and 64_2 may extend parallel to the X-axis and may be disposed adjacent to an edge of the first integrated circuit 63 extending parallel to the X-axis. That is, as shown in FIG. 8, each of the second integrated circuits 64_1 and 64_2 may be disposed adjacent to edges of the first integrated circuit 63 that face each other in a Y-axis direction. The arrangement of the first integrated circuit 63 and the second integrated circuits 64_1 and 64_2 illustrated in FIG. 8 is only an example, and various embodiments may be applied.

The discrete devices 65 may include at least one passive device having a relatively large value and/or a relatively high withstand voltage. For example, the discrete devices 65 may include a bypass (or decoupling) capacitor for a stable supply voltage. The PMIC 66 may supply power to elements of the antenna module 60, for example, the first integrated circuit 63 and the second integrated circuits 64_1 and 64_2, from power provided through the connector 62. For example, the PMIC 66 may generate at least one supply voltage, and transmit the at least one supply voltage to the first integrated circuit 63 and the second integrated circuits 64_1 and 64_2 through patterns included in the multi-layer substrate 61.

Figure 9:
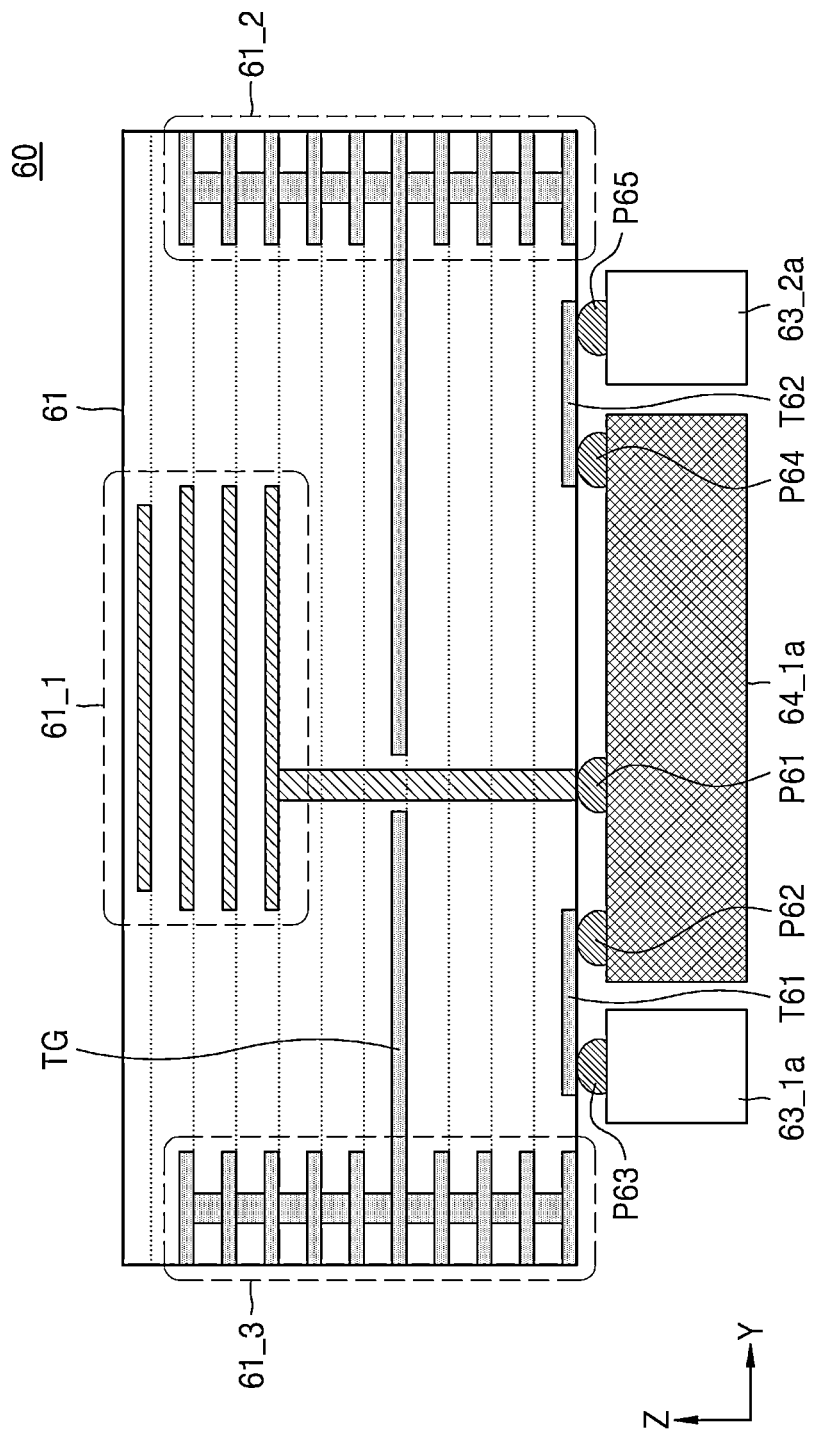
FIG. 9 illustrates an example of an antenna module according to an example embodiment.

FIG. 9 illustrates an example of an antenna module 60 according to an example embodiment. Specifically, FIG. 9 is a cross-sectional view illustrating examples of a cross-section taken in a plane perpendicular to the X-axis of the antenna module 60 of FIG. 8. Hereinafter, FIG. 9 will be described with reference to FIG. 8, and redundant descriptions in FIG. 9 and redundant descriptions between FIG. 9 and FIG. 8 will be omitted.

Referring to FIG. 9, the antenna module 60 may include a multi-layer substrate 61, and may include first integrated circuits 63_1a and 63_2a and a second integrated circuit 64_1a on a lower surface of the multi-layer substrate 61. FIG. 9 illustrates that the first integrated circuits 63_1a and 63_2a are divided into two parts, but this is for convenience of description. The first integrated circuits 63_1a and 63_2a may not be actually separated. Hereinafter, it is assumed that the first integrated circuit 63_1a on the left is a part including a transmission chain, and the first integrated circuit 63_2a on the right is a part including a reception chain, and for convenience of description, it is assumed that the first integrated circuit 63_1a on the left is referred to as a first part of the first integrated circuit, and the first integrated circuit 63_2a on the right is referred to as a second part of the first integrated circuit.

In an example embodiment, the multi-layer substrate 61 may include a patch antenna 61_1 configured to transmit and receive electromagnetic waves through an upper surface of the multi-layer substrate 61, and may include patterns and vias for connecting the patch antenna 61_1 to input/output pin P61 of the second integrated circuit 64_1a. In addition, the multi-layer substrate 61 may include a ground plate TG below the patch antenna 61_1, and may include first and second heat dissipation structures 61_2 and 61_3. In some embodiments, as shown in FIG. 9, the first and second heat dissipation structures 61_2 and 61_3 may be connected to the ground plate TG, and accordingly, the first and second heat dissipation structures 61_2 and 61_3 may have a ground potential. In some embodiments, the first and second heat dissipation structures 61_2 and 61_3 may have shapes different from those shown in FIG. 9, and may be disposed differently from that shown in FIG. 9. In addition, the multi-layer substrate 61 may include three or more heat dissipation structures in some embodiments, and in some embodiments, the first and second heat dissipation structures 61_2 and 61_3 may be combined into one structure, for example, a structure surrounding the patch antenna 61_1.

The multi-layer substrate 61 may include patterns for respectively connecting the first part 63_1a of the first integrated circuit and the second part 63_2a of the first integrated circuit to the second integrated circuit 64_1a. For example, the multi-layered substrate 61 may include a first pattern T61 for connecting a second output pin P62 of the second integrated circuit 64_1a and a first output pin P63 of the first part 63_1a of the first integrated circuit, and a second pattern T62 for connecting a second input pin P64 of the second integrated circuit 64_1a and a first input pin P65 of the second part 63_2a of the first integrated circuit.

In an example embodiment, terminals of an active device (not shown) included in the second integrated circuit 64_1a may be respectively connected to the input/output pin P61, the second output pin P62, and the second input pin P64. Specifically, a gate terminal of the active device (not shown) may be connected to the second output pin P62, a drain terminal thereof may be connected to the second input pin P64 and the input/output pin P61, and a source terminal thereof may be grounded. In some embodiments, the input/output pin P61 may be connected to the second input pin P64 through a certain conductive line included in the second integrated circuit 64_1a.

Figure 10A:
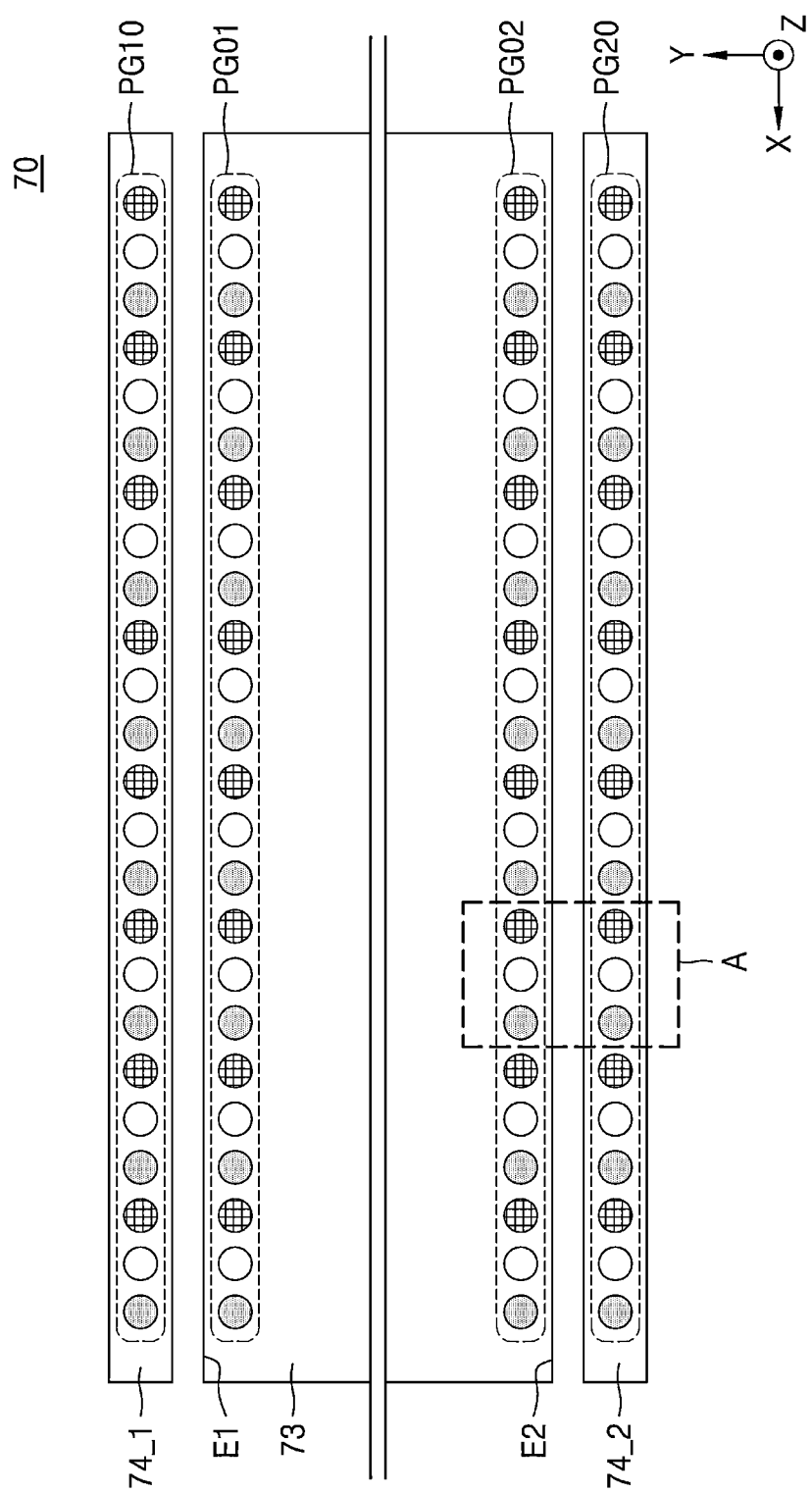
FIG. 10A shows an antenna module according to an example embodiment.
Figure 10B:
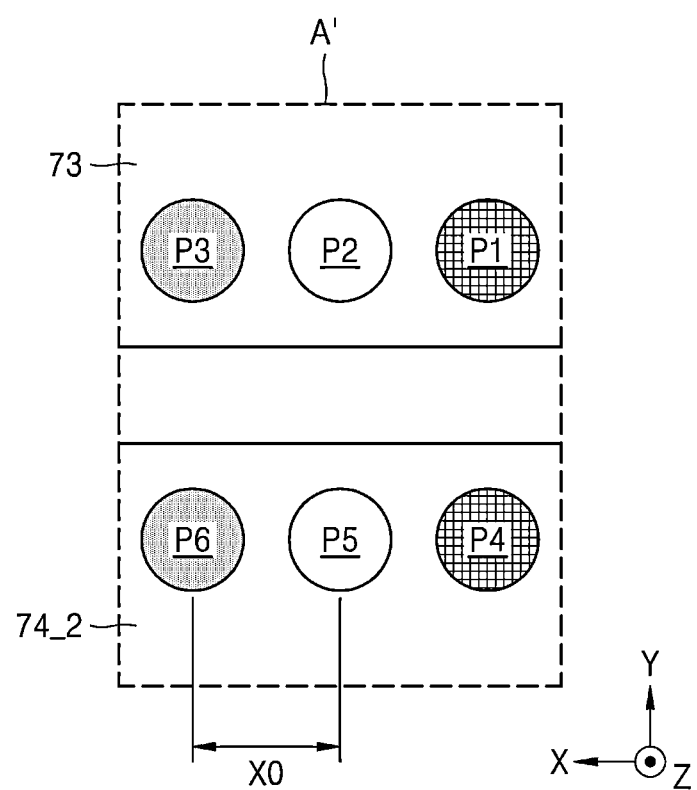
FIG. 10B shows an enlarged region A of FIG. 10A according to an example embodiment.

FIG. 10A shows an antenna module 70 according to an example embodiment, and FIG. 10B shows an enlarged region A of FIG. 10A according to an example embodiment.

Specifically, FIGS. 10A and 10B are plan views illustrating examples of the antenna module 60 of FIG. 8 viewed from a lower surface of the multi-layer substrate 61 in the −Z-axis direction. Hereinafter, FIGS. 10A and 10B are described with reference to FIG. 8.

Referring to FIG. 10A, the antenna module 70 may include a first integrated circuit 73 and second integrated circuits 74_1 and 74_2. The first integrated circuit 73 may include a plurality of first pins PG01 including pins to be connected to the second integrated circuit 74_1 and a plurality of second pins PG02 including pins to be connected to the other second integrated circuit 74_2. The second integrated circuit 74_1 may include a plurality of pins PG10 including pins to be connected to the second integrated circuit 73, and the other second integrated circuit 74_2 may include a plurality of pins PG20 including pins to be connected to the second integrated circuit 73.

As shown in FIG. 10A, the second integrated circuit 74_1 may be disposed adjacent to a first edge E1 of the first integrated circuit 73, and the plurality of first pins PG01 of the first integrated circuit 73 may be arranged parallel to the first edge E1. The second integrated circuit 74_1 may extend parallel to the first edge E1, and the plurality of pins PG10 of the second integrated circuit 74_1 may also be arranged parallel to the first edge E1. In addition, the other second integrated circuit 74_2 may be disposed adjacent to a second edge E2 of the first integrated circuit 73, and the plurality of second pins PG02 of the first integrated circuit 73 may be arranged parallel to the second edge E2. The other second integrated circuit 74_2 may extend parallel to the second edge E2, and the plurality of pins PG20 of the other second integrated circuit 74_2 may also be arranged parallel to the second edge E2.

Referring to FIG. 10B, the pins of the first integrated circuit 73 and the pins of the second integrated circuit 74_2 may be spaced apart from each other by the same pitch XO. As described above with reference to FIG. 3A, etc., when the second integrated circuit 74_2 includes a transistor as an active device and includes pins connected to terminals (or electrodes) of the transistor, an input pin, an output pin, and a ground pin may be repeated in the second integrated circuit 74_2. For example, first to third pins P1 to P3 of the first integrated circuit 73 may correspond to the input pin, the ground pin, and the output pin, respectively, and fourth to sixth pins P4 to P6 of the second integrated circuit 74_2 may correspond to the input pin, the ground pin, and the output pin, respectively. Alternatively, the first to third pins P1 to P3 of the first integrated circuit 73 may correspond to the output pin, the ground pin, and the input pin, respectively, and the fourth to sixth pins P4 to P6 of the second integrated circuit 74_2 may correspond to the input pin, the ground pin, and the output pin, respectively. Meanwhile, as will be described later with reference to FIG. 11, the multi-layer substrate (e.g., 61 in FIG. 8) may include patterns for interconnecting the input pins and output pins of the first integrated circuit 73 and the second integrated circuit 74_2.

Figure 11:
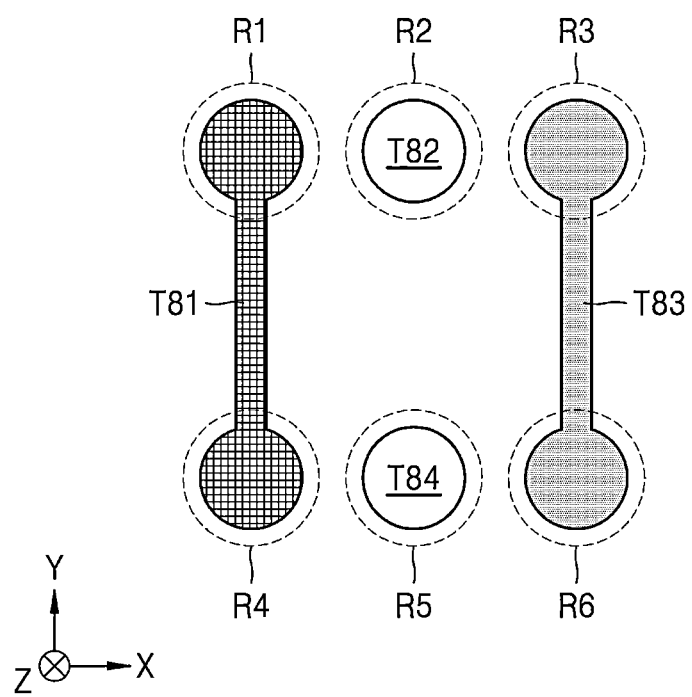
FIG. 11 illustrates a multi-layer substrate according to an example embodiment.

FIG. 11 illustrates a multi-layer substrate 80 according to an example embodiment. In some embodiments, the first integrated circuit 73 and the second integrated circuit 74_2 of FIG. 10B may be disposed on a lower surface of the multi-layer substrate 80 of FIG. 11, and FIG. 11 illustrates an example of patterns for the first to sixth pins P1 to P6 of FIG. 10B. Hereinafter, FIG. 11 will be described with reference to FIG. 10B.

Referring to FIG. 11, the multi-layer substrate 80 may include first to fourth patterns T81 to T83. The first pattern T81 may interconnect the first and fourth pins P1 and P4 of FIG. 10B, and the third pattern T83 may interconnect the third and sixth pins P3 and P6 of FIG. 10B. Also, the second pattern T82 may be connected to the second pin P2 of FIG. 10B, and the fourth pattern T84 may be connected to the fifth pin P5 of FIG. 10B. As described above with reference to FIG. 10B, the first to third pins P1 to P3 of the first integrated circuit 73 and the fourth to sixth pins P4 to P6 of the second integrated circuit 74_2 may be spaced apart from each other by the same pitch in the X-axis direction, and accordingly, as shown in FIG. 10B, the first and third patterns T81 and T83 may extend parallel to the Y-axis and may be arranged in the X-axis. Also, for connection with the pin, the pattern may include a region exposed to the outside. For example, as shown in FIG. 11, in the first to sixth regions R1 to R6, the first to fourth patterns T81 to T84 may be exposed to the outside, and the exposed region may be referred to as a pad.

Figure 12A:
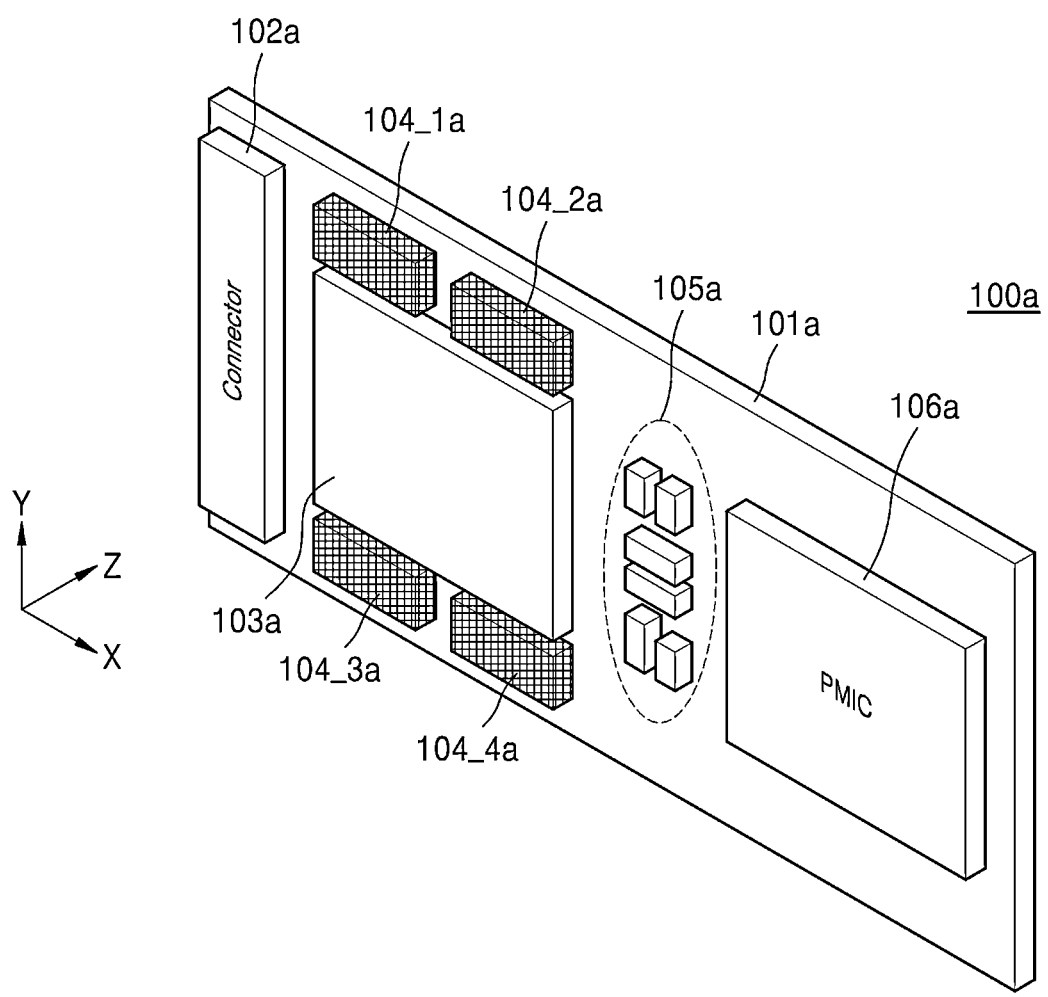
FIGS. 12A to 12C illustrate examples of an antenna module according to example embodiments.
Figure 12B:
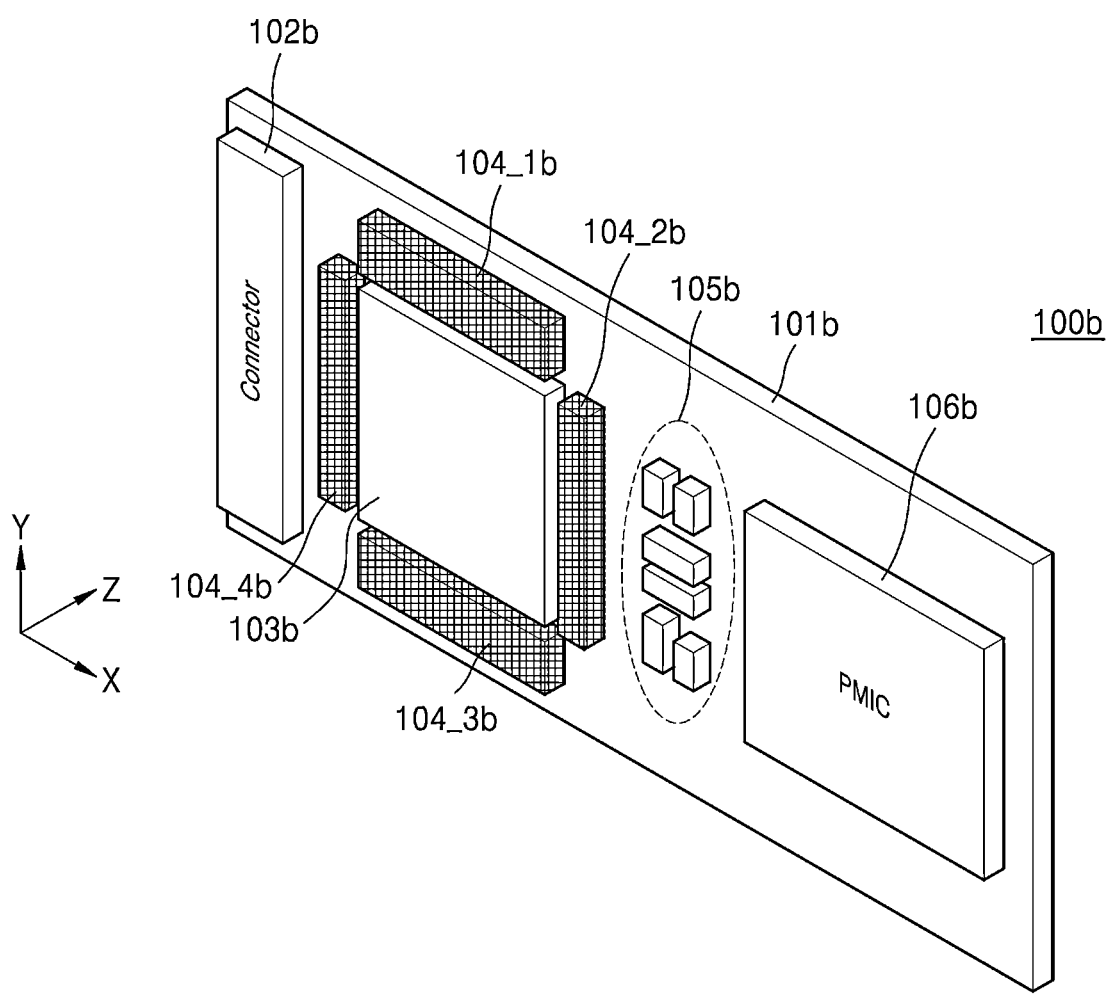
Figure 12C:
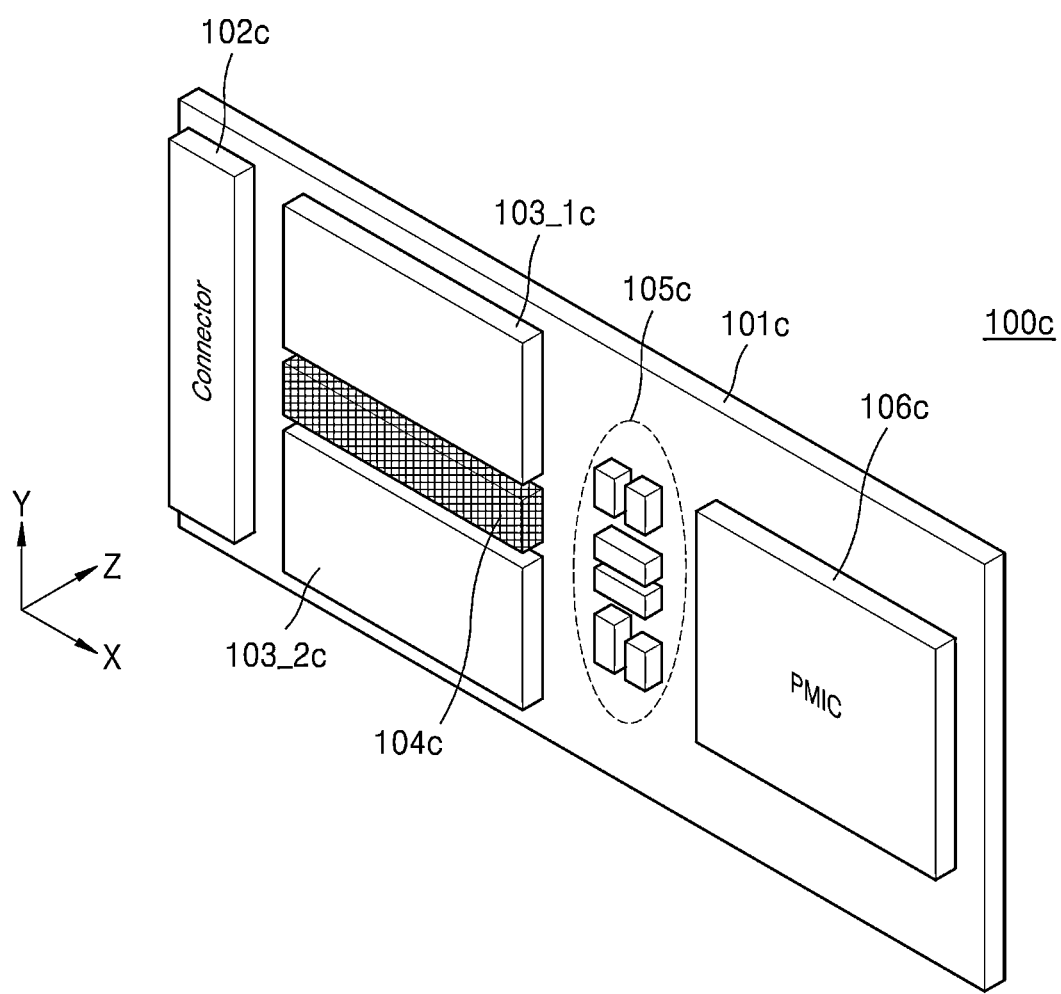

FIGS. 12A to 12C respectively illustrate examples of antenna modules 100a, 100b, and 100c according to example embodiments. Specifically, FIGS. 12A to 12C are perspective views illustrating the antenna modules 100a, 100b, and 100c corresponding to various combinations of a first integrated circuit and a second integrated circuit. Hereinafter, redundant descriptions between FIGS. 12A to 12C and FIG. 8 will be omitted.

Referring to FIG. 12A, the antenna module 100a may include a multi-layer substrate 101a, a connector 102a, a first integrated circuit 103a, four second integrated circuits 104_1a to 104_4a, discrete devices 105a, and a PMIC 106a. As shown in FIG. 12A, the two second integrated circuits 104_1a and 104_2a may extend parallel to the X-axis, and may be equally spaced apart from each other in one edge of the first integrated circuit 103a in the Y-axis direction. Similarly, the remaining two second integrated circuits 104_3a and 104_4a may extend parallel to the X-axis and may be equally spaced apart from each other in one edge of the first integrated circuit 103a.

Referring to FIG. 12B, the antenna module 100b may include a multi-layer substrate 101b, a connector 102b, a first integrated circuit 103b, four second integrated circuits 104_1b to 104_4b, discrete devices 105b, and a PMIC 106b. As illustrated in FIG. 12B, the second integrated circuits 104_1b to 104_4b may be disposed adjacent to four edges of the first integrated circuit 103b, respectively.

Referring to FIG. 12C, the antenna module 100c may include a multi-layer substrate 101c, a connector 102c, first integrated circuits 103_1c and 103_2c, a second integrated circuit 104c, discrete devices 105c, and a PMIC 106c. In some embodiments, the antenna module 100c may include a plurality of first integrated circuits, and the plurality of first integrated circuits may share at least one second integrated circuit. For example, as shown in FIG. 12C, the second integrated circuit 104c may be disposed between the two first integrated circuits 103_1c and 103_2c, and connected to each of the first integrated circuits 103_1c and 103_2c. Accordingly, some active devices included in the second integrated circuit 104c may be connected to one first integrated circuit 103_1c, and the remaining active devices may be connected to the other first integrated circuit 103_2c.

Figure 13:
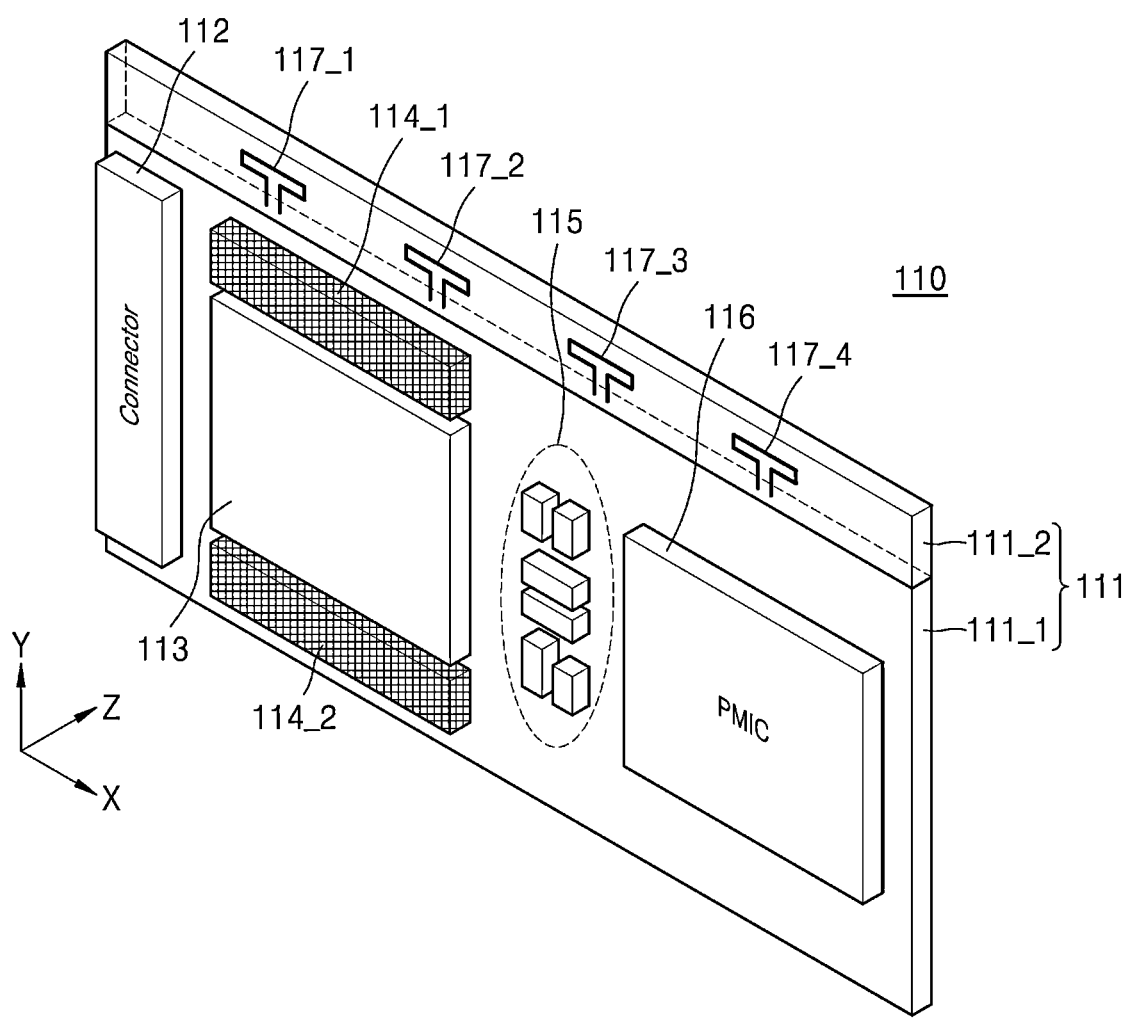
FIG. 13 illustrates an antenna module according to an example embodiment.

FIG. 13 illustrates an antenna module 110 according to an example embodiment. Specifically, FIG. 13 is a perspective view illustrating the antenna module 110 including dipole antennas. As shown in FIG. 13, the antenna module 110 may include a multi-layer substrate 111, a connector 112, a first integrated circuit 113, second integrated circuits 114_1 and 114_2, discrete devices 115, and a PMIC 116. Hereinafter, redundant descriptions between FIG. 13 and FIG. 8 will be omitted.

The multi-layer substrate 111 may include first to fourth dipole antennas 117_1 to 117_4. As shown in FIG. 13, the multi-layer substrate 111 may include a first region 111_1 including a patch antenna for transmitting and receiving electromagnetic waves through an upper surface of the multi-layer substrate 111, that is, a surface exposed in the +Z axis direction, and a second region 111_2 including a dipole antenna, and the connector 112, the first integrated circuit 113, the second integrated circuits 114_1 and 114_2, the discrete devices 115, and the PMIC 116 may be disposed on a lower surface of the first region 111_1. The first to fourth dipole antennas 117_1 to 117_4 may be connected to the second integrated circuits 114_1 and 114_2, and may transmit and receive electromagnetic waves through a side surface of the multi-layer substrate 111, for example, a surface perpendicular to the Y axis. It should be understood that the example embodiments are not limited to the shapes and numbers of the first to fourth dipole antennas 117_1 to 117_4 shown in FIG. 13.

Figure 14:
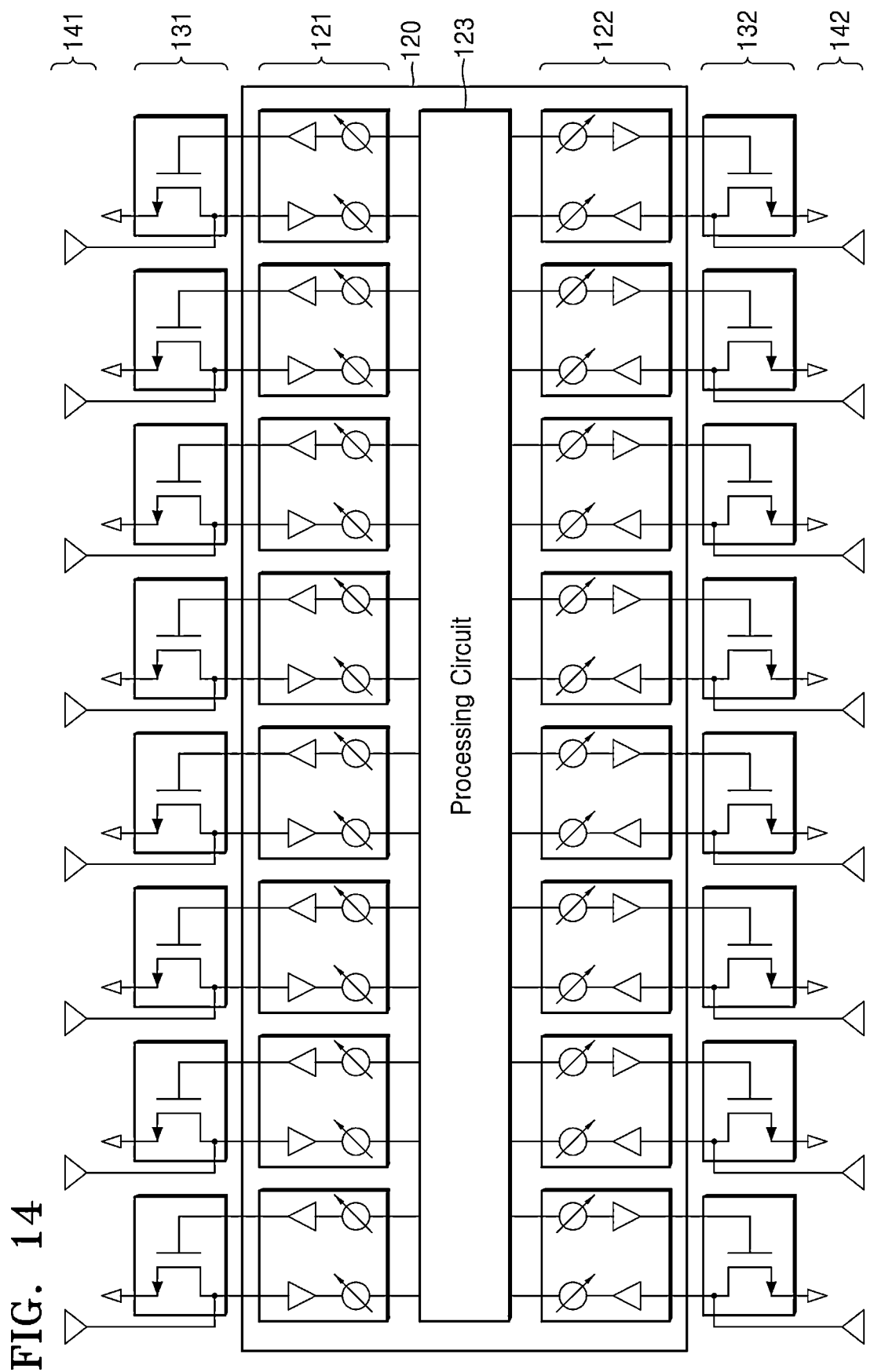
FIG. 14 illustrates an example of a first integrated circuit according to an example embodiment.

FIG. 14 illustrates an example of a first integrated circuit 120 according to an example embodiment. Specifically, FIG. 14 illustrates a block diagram of the first integrated circuit 120 including sixteen transmission chains and sixteen reception chains.

Referring to FIG. 14, the first integrated circuit 120 may include eight first transmission/reception chains 121, eight second transmission/reception chains 122, and a processing circuit 123. The first transmission/reception chains 121 and the second transmission/reception chains 122 may be respectively connected to transistors included in second integrated circuits 131 and 132, respectively. For example, a gate terminal of a transistor included in each of the second integrated circuits 131 and 132 may be connected to the transmission chain of the first integrated circuit 120, a drain terminal thereof may be connected to the reception chain of the first integrated circuit 120, and a source terminal thereof may be grounded. The processing circuit 123 may be connected to the first transmission/reception chains 121 and the second transmission/reception chains 122, and may include switches, a combiner/divider, a mixer, an LO generator, etc. Each of the transistors included in the second integrated circuits 131 and 132 may be connected to antennas included in antenna arrays 141 and 142 through the drain terminal. Meanwhile, each of the first transmission/reception chains 121 and the second transmission/reception chains 122 may include a phase shifter, a power amplifier and a low noise amplifier, and furthermore, may further include a matching network designed in the manner described above with reference to FIGS. 4 to 6C.

The processing circuit 123 may also provide control signals to other elements such as the first switch SW1, the second switch SW2, control circuit, etc. The processing circuit 123 may determine when to switch the transceiver 24 to and from the transmission mode and reception mode and provide control signals to control the transceiver to inter into the transmission mode or the reception mode.

Additionally, the Data processor 16, processing circuitry 123, and/or the components included therein may include processing circuitry such as hardware including logic circuits; a hardware/software combination such as a processor executing software; or a combination thereof. For example, the processing circuitry may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

While the inventive concepts have been particularly shown and described with reference to embodiments thereof, it should be understood that various changes in form and details may be made therein without departing from the spirit and scope of the following claims.

What is claimed is:

1. A transceiver comprising:
 a first integrated circuit including a transmission chain, a reception chain, and a control circuit, the transmission chain configured to transmit a first radio frequency (RF) signal, the reception chain configured to receive a second RF signal, and the control circuit configured to selectively ground any one of the transmission chain and the reception chain based on a transmission mode or a reception mode;
 a second integrated circuit including an active device connected to the transmission chain and the reception chain; and
 an antenna array including an antenna connected to the active device,
 wherein the control circuit includes a matching network, the matching network being included along one of a transmission path corresponding to the transmission chain or a reception path corresponding to the reception chain based on the transmission mode or the reception mode.

2. The transceiver of claim 1, wherein
 the active device is a high electron mobility transistor (HEMT),
 a gate terminal of the HEMT is connected to the transmission chain,
 a drain terminal of the HEMT is connected to the reception chain, and
 a source terminal of the HEMT is grounded.

3. The transceiver of claim 1, wherein
 the first integrated circuit is implemented in a complementary metal oxide semiconductor (CMOS) process, and
 the second integrated circuit is implemented in a Group III-V compound semiconductor process.

4. The transceiver of claim 1, wherein the control circuit includes a first switch configured to ground the reception chain in the transmission mode.

5. The transceiver of claim 1, wherein the matching network is configured to be included along the transmission path in the transmission mode and to be included along the reception path in the reception mode.

6. The transceiver of claim 1, wherein the matching network includes a plurality of passive devices designed to have a target reactance associated with the active device.

7. The transceiver of claim 1, further comprising:
 a first conductive line configured to connect the transmission chain to the active device and a second conductive line configured to connect the reception chain to the active device, between the first integrated circuit and the second integrated circuit, and
 wherein the matching network includes a plurality of passive devices designed to have a target reactance associated with the active device, the first conductive line, and the second conductive line.

8. The transceiver of claim 1, wherein
 the second integrated circuit further includes an electro static discharge (ESD) protection circuit, and
 the matching network includes a plurality of passive devices designed to have a target reactance associated with the active device and at least one passive device comprised in the ESD protection circuit.

9. The transceiver of claim 1, wherein
 the transmission chain includes a first phase shifter and at least one power amplifier, and
 the reception chain includes a second phase shifter and at least one low noise amplifier.

10. The transceiver of claim 9, wherein the at least one power amplifier and the active device are comprised in a multi-stage amplification structure.

11. The transceiver of claim 1, wherein
 the first integrated circuit further includes: a combiner/divider; and
 a single-pole-double-throw (SPDT) switch configured to connect any one of the transmission chain and the reception chain to the combiner/divider according to the transmission mode or the reception mode.

12. The transceiver of claim 1, wherein the antenna is configured to transmit the first RF signal and receive the second RF signal through an upper surface of a multi-layer substrate.

13. A transceiver comprising:
 a first integrated circuit including a transmission chain configured to transmit a first radio frequency (RF) signal, a reception chain configured to receive a second RF signal, a first output pin connected to the transmission chain, and a first input pin connected to the reception chain;
 an antenna array including an antenna configured to transmit the first RF signal to an outside or to receive the second RF signal from the outside; and
 a second integrated circuit including a second output pin connected to the first output pin, a second input pin connected to the first input pin, an input/output pin connected to the antenna, and a transistor connected to the input/output pin, a gate terminal of the transistor being connected to the second output pin, a drain terminal of the transistor being connected to the second input pin, and a source terminal of the transistor being grounded, wherein
 the first integrated circuit is implemented in a complementary metal oxide semiconductor (CMOS) process, and
 the second integrated circuit is implemented in a Group III-V compound semiconductor process.

14. The transceiver of claim 13, wherein the transistor is configured to amplify the first RF signal received from the second output pin and output the first RF signal to the input/output pin, or output the second RF signal received from the input/output pin to the second input pin.

15. The transceiver of claim 13, wherein
the transistor is a high electron mobility transistor (HEMT).

16. The transceiver of claim 13, wherein the first integrated circuit further includes a control circuit including a switch configured to ground the reception chain in a transmission mode.

17. The transceiver of claim 16, wherein the control circuit further includes a matching network configured to be included along a transmission path in the transmission mode and to be included along a reception path in a reception mode.

18. The transceiver of claim 17, wherein the matching network includes a plurality of passive devices designed to have a target reactance associated with the transistor.

19. An antenna module comprising:
a multi-layer substrate including an antenna configured to transmit and receive electromagnetic waves through an upper surface of the multi-layer substrate;
a first integrated circuit including, on a lower surface of the multi-layer substrate, a transmission chain, a reception chain, a first output pin connected to the transmission chain, and a first input pin connected to the reception chain; and
a second integrated circuit including, on the lower surface of the multi-layer substrate, a second output pin connected to the first output pin, a second input pin connected to the first input pin, an input/output pin connected to the antenna, and an active device connected to the second output pin, the second input pin and the input/output pin,
wherein the active device is configured to amplify a first radio frequency (RF) signal received from the transmission chain through the second output pin and output the first RF signal to the antenna through the input/output pin in a transmission mode or output a second RF signal received from the antenna through the input/output pin to the reception chain through the second input pin in a reception mode.

* * * * *